United States Patent
Harada et al.

(10) Patent No.: US 10,354,936 B2
(45) Date of Patent: Jul. 16, 2019

(54) ELECTRONIC COMPONENT HAVING A HEAT DISSIPATION MEMBER FORMED ON A SEALING MEMBER

(71) Applicant: ROHM CO., LTD., Kyoto (JP)

(72) Inventors: Yusuke Harada, Kyoto (JP); Yasuhiro Fuwa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/646,311

(22) Filed: Jul. 11, 2017

(65) Prior Publication Data
US 2018/0019177 A1 Jan. 18, 2018

(30) Foreign Application Priority Data

Jul. 14, 2016 (JP) .................. 2016-139707

(51) Int. Cl.
*H01L 23/34* (2006.01)
*H01L 23/36* (2006.01)
*H01L 21/768* (2006.01)
*H01L 23/29* (2006.01)
*H01L 23/498* (2006.01)

(52) U.S. Cl.
CPC ........ *H01L 23/36* (2013.01); *H01L 21/76871* (2013.01); *H01L 23/29* (2013.01); *H01L 23/49827* (2013.01); *H01L 23/49838* (2013.01)

(58) Field of Classification Search
CPC ............... H01L 23/36; H01L 21/76871; H01L 23/49827; H01L 23/29; H01L 23/49838
See application file for complete search history.

(56) References Cited

U.S. PATENT DOCUMENTS

| | | | | |
|---|---|---|---|---|
| 6,146,921 A * | 11/2000 | Barrow | ................. | H01L 21/565 257/706 |
| 6,724,080 B1 * | 4/2004 | Ooi | ......................... | H01L 23/36 257/704 |
| 8,754,521 B1 * | 6/2014 | Carpenter | ............. | H01L 23/433 257/706 |
| 9,478,504 B1 * | 10/2016 | Shen | ................. | H01L 23/49838 |
| 2001/0023118 A1 * | 9/2001 | MacPherson | ........... | H01L 21/56 438/584 |
| 2002/0149102 A1 * | 10/2002 | Hashemi | ............. | H01L 23/3677 257/706 |
| 2004/0021210 A1 * | 2/2004 | Hosomi | .............. | H01L 25/0657 257/686 |
| 2004/0046241 A1 * | 3/2004 | Combs | ................ | H01L 23/3128 257/678 |
| 2008/0096325 A1 * | 4/2008 | Kao | ........................ | H01L 23/13 438/122 |
| 2008/0122067 A1 * | 5/2008 | Wang | .................. | H01L 23/4334 257/706 |
| 2009/0166890 A1 * | 7/2009 | Chrysler | ............... | H01L 23/367 257/778 |

(Continued)

FOREIGN PATENT DOCUMENTS

JP 2013-197263 A 9/2013

*Primary Examiner* — Ismail A Muse
(74) *Attorney, Agent, or Firm* — Rabin & Berdo, P.C.

(57) ABSTRACT

An electronic component includes a substrate having a principal surface, a chip arranged at the principal surface of the substrate, a sealing resin sealing the chip on the principal surface of the substrate, and a heat dissipation member formed on the sealing resin.

19 Claims, 22 Drawing Sheets

(56) References Cited

U.S. PATENT DOCUMENTS

| | | | | |
|---|---|---|---|---|
| 2009/0239329 A1* | 9/2009 | Yee | ................... | H01L 27/14618 438/68 |
| 2010/0210074 A1* | 8/2010 | Kim | ................. | G06K 19/07743 438/126 |
| 2011/0012157 A1* | 1/2011 | Shi | ........................ | H01L 33/507 257/98 |
| 2011/0291249 A1* | 12/2011 | Chi | .................... | H01L 21/4832 257/675 |
| 2013/0069218 A1* | 3/2013 | Seah | ....................... | H01L 23/13 257/712 |
| 2013/0221521 A1* | 8/2013 | Yang | ................... | B23K 1/0016 257/737 |
| 2014/0048906 A1* | 2/2014 | Shim | ..................... | H01L 23/481 257/531 |
| 2014/0110728 A1* | 4/2014 | Lee | ........................ | H01L 33/62 257/88 |
| 2014/0213018 A1* | 7/2014 | Higgins, III | ............ | H01L 23/36 438/118 |
| 2014/0353816 A1* | 12/2014 | Yap | ..................... | H01L 23/3735 257/713 |
| 2015/0249021 A1* | 9/2015 | Sanchez | .............. | H01L 23/4334 438/122 |
| 2015/0257275 A1* | 9/2015 | Kusama | ................ | H05K 1/185 174/260 |
| 2015/0371975 A1* | 12/2015 | Shimizu | ................ | H01L 33/486 257/88 |
| 2016/0372426 A1* | 12/2016 | Luan | .................... | H01L 21/561 |
| 2017/0084513 A1* | 3/2017 | Hsu | ........................ | H01L 23/36 |
| 2017/0317000 A1* | 11/2017 | Nishimura | ......... | H01L 25/0655 |
| 2018/0350754 A1* | 12/2018 | Huang | ............... | H01L 21/4853 |
| 2019/0043772 A1* | 2/2019 | Muthur Srinath | ...... | H01L 23/26 |

\* cited by examiner

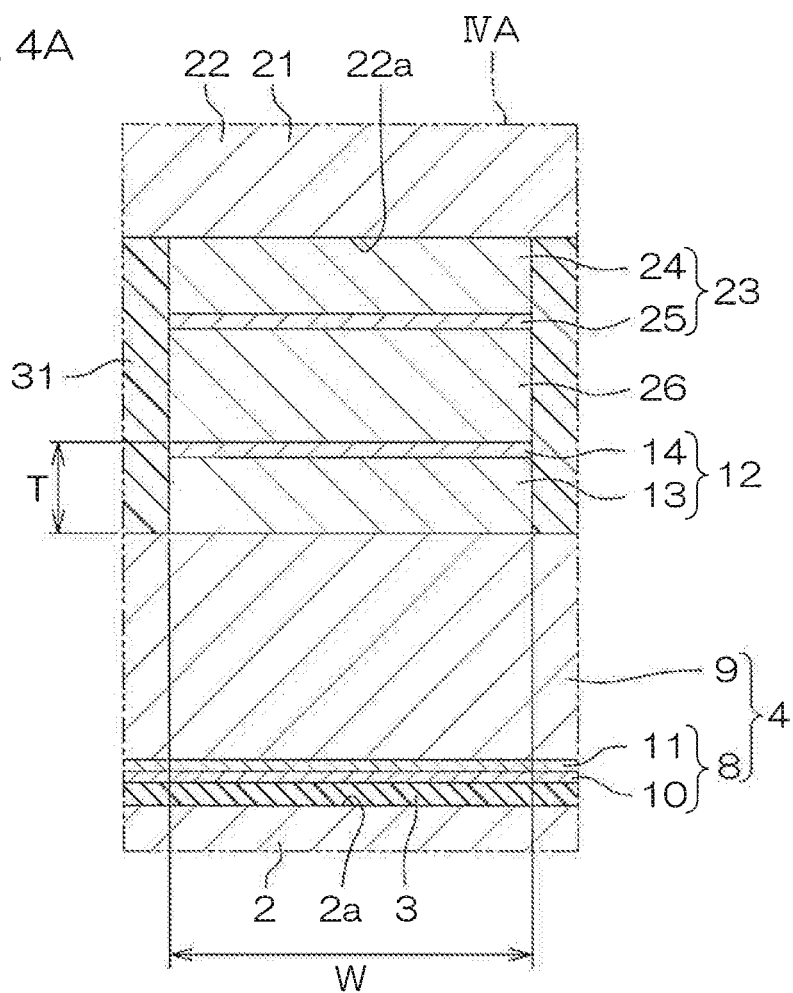
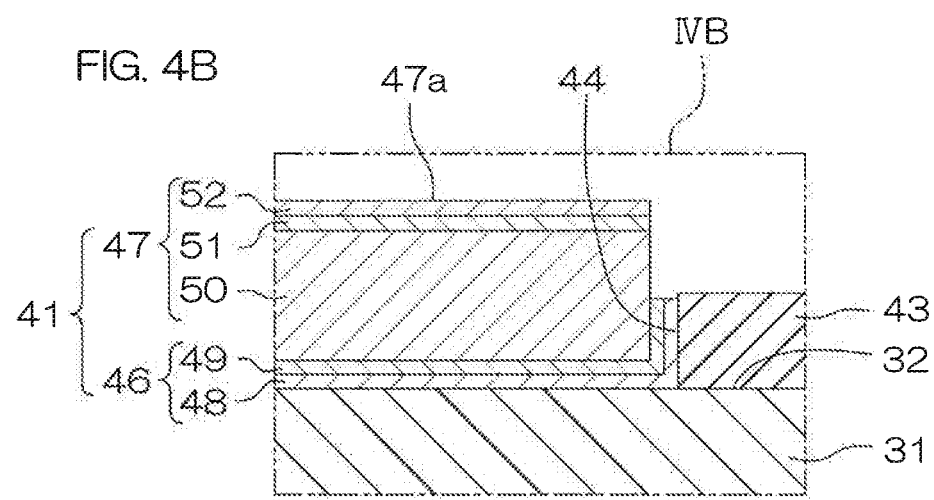

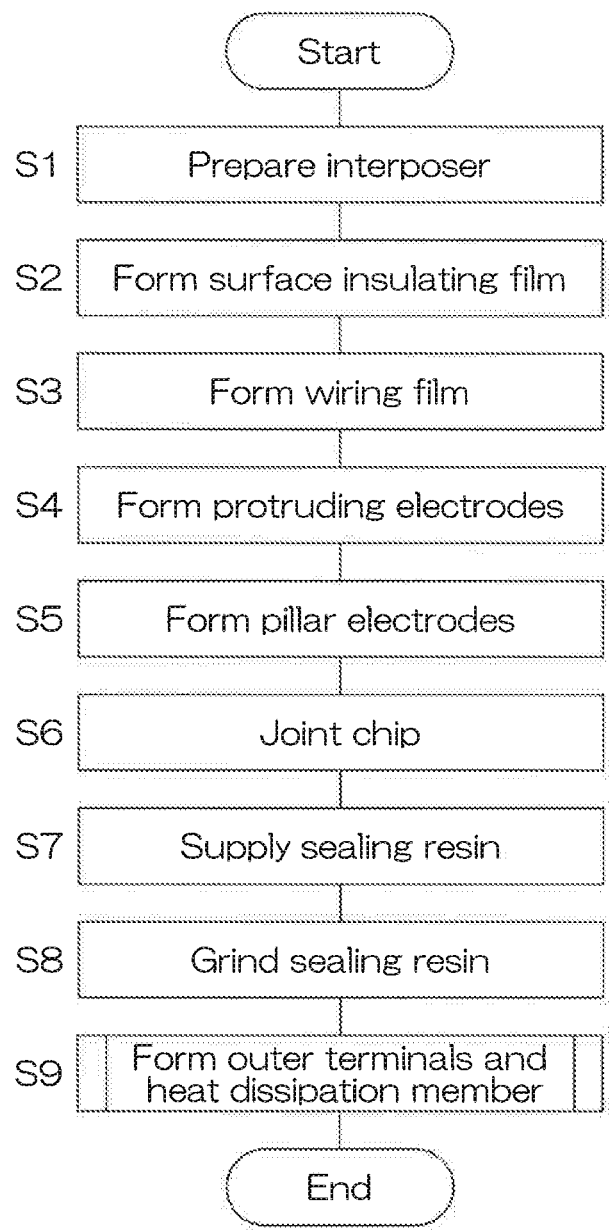

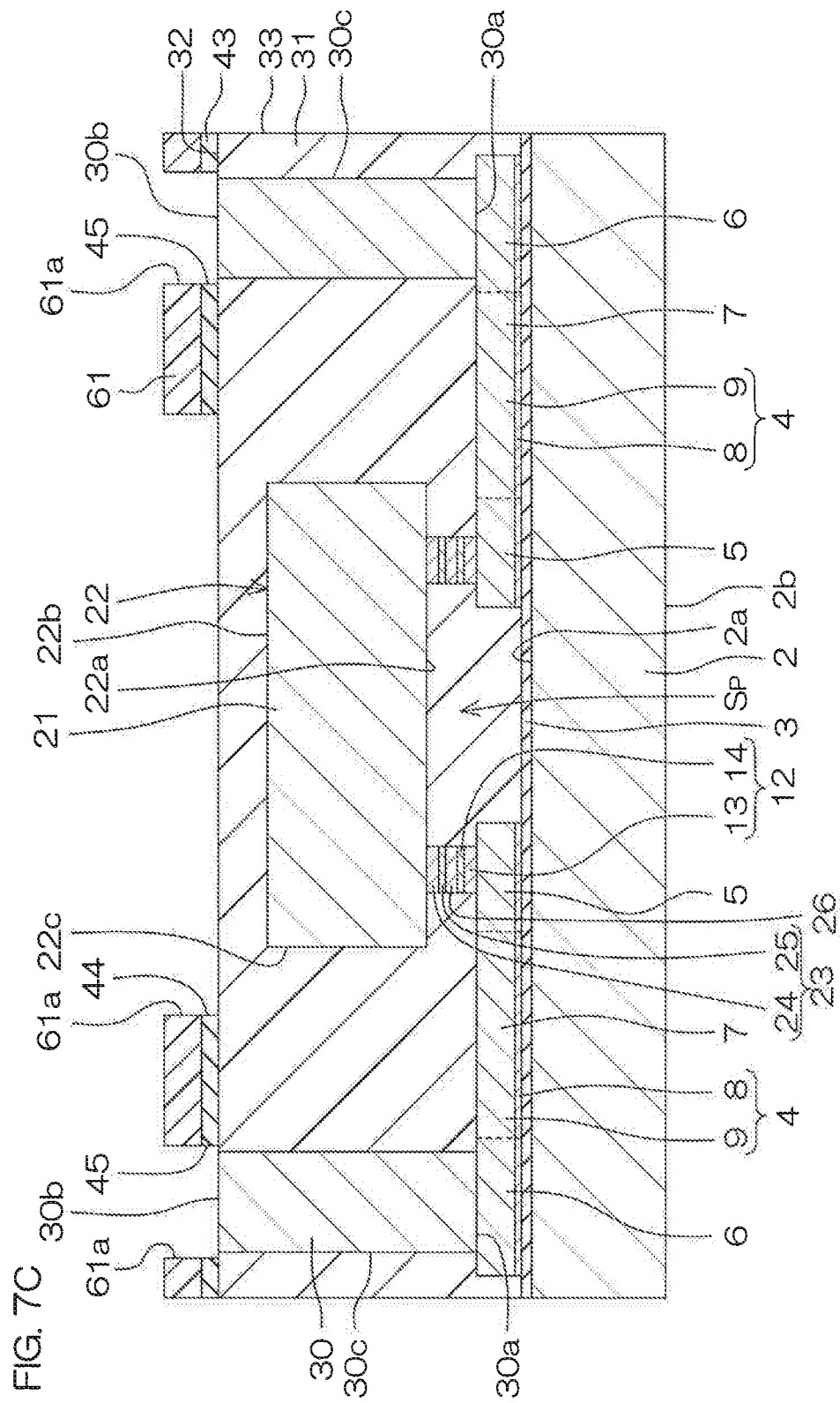

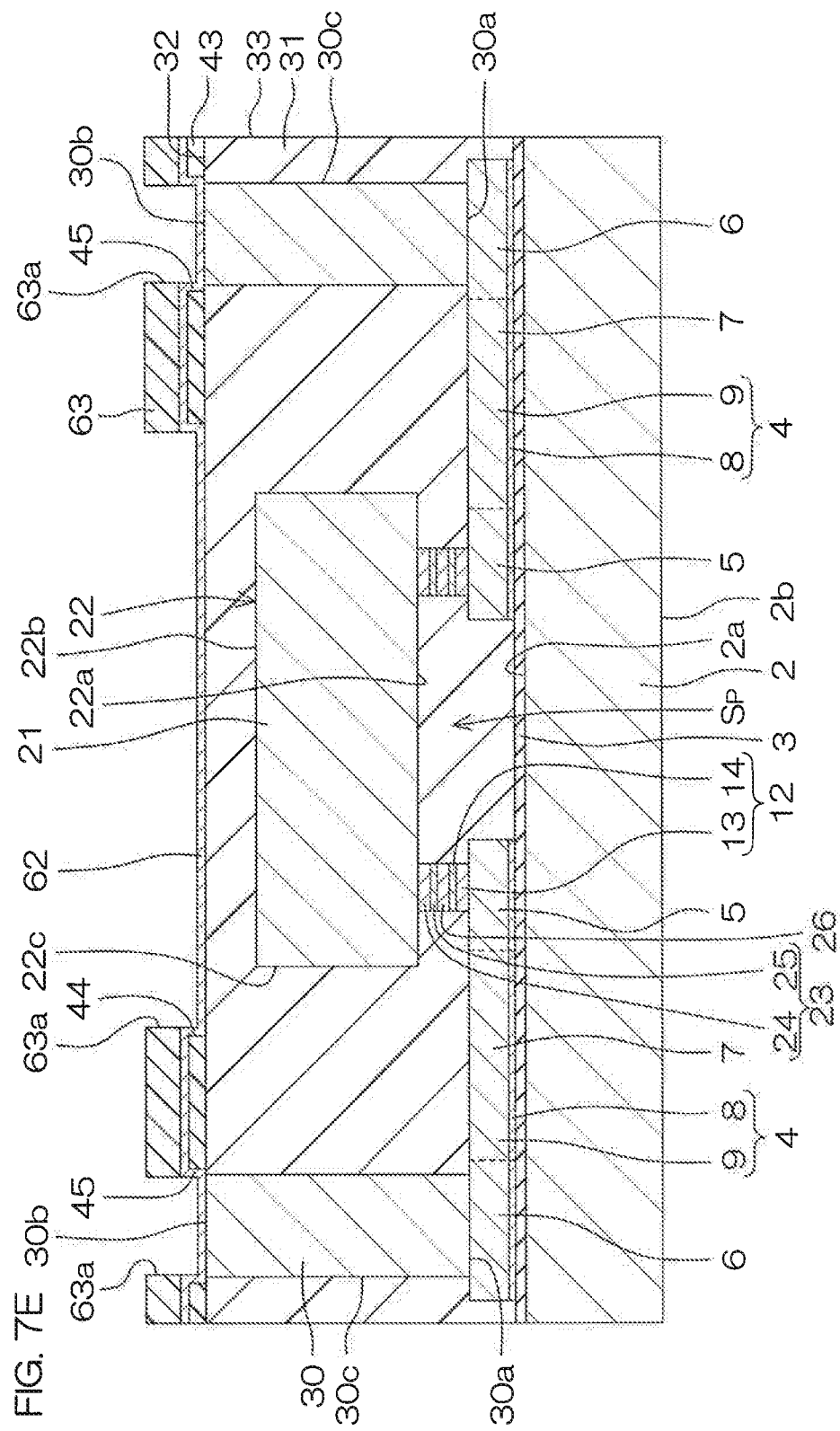

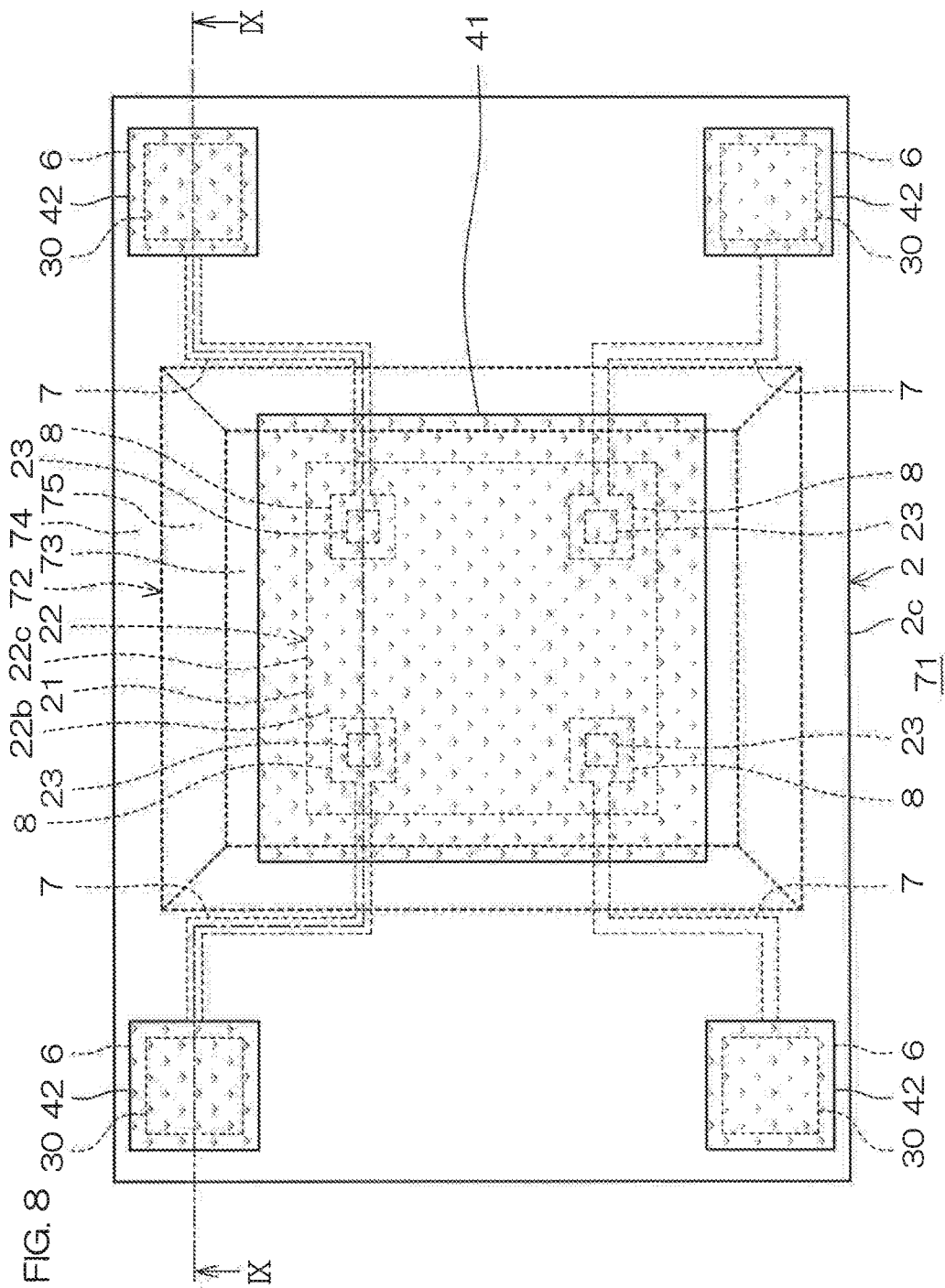

US 10,354,936 B2

ELECTRONIC COMPONENT HAVING A HEAT DISSIPATION MEMBER FORMED ON A SEALING MEMBER

BACKGROUND OF THE INVENTION

1. Field of the Invention

The present invention relates to an electronic component and a method for manufacturing thereof.

2. Description of the Related Art

JP2013-197263 discloses a semiconductor device that includes a wiring body having one surface and one other surface, an external terminal formed at the one surface of the wiring body, a semiconductor chip arranged at the one other surface of the wiring body, and a sealing resin that seals the semiconductor chip at the one other surface of the wiring body.

SUMMARY OF THE INVENTION

One preferred embodiment of the present invention provides an electronic component including a substrate having a principal surface, a chip arranged at the principal surface of the substrate, a sealing resin sealing the chip on the principal surface of the substrate, and a heat dissipation member formed on the sealing resin.

One preferred embodiment of the present invention provides an electronic component including, a substrate having a principal surface at which a recessed portion is formed, a chip arranged at the principal surface of the substrate so as to be accommodated in the recessed portion, a sealing resin filling the recessed portion and sealing the chip, and a heat dissipation member formed on the sealing resin.

One preferred embodiment of the present invention provides a method for manufacturing an electronic component including the steps of preparing a substrate having a principal surface, arranging a chip at the principal surface of the substrate, supplying a sealing resin onto the principal surface of the substrate and sealing the chip with the sealing resin, and forming a heat dissipation member on the sealing resin.

One preferred embodiment of the present invention provides a method for manufacturing an electronic component including the steps of preparing a substrate having a principal surface, forming a recessed portion at the principal surface of the substrate, arranging a chip at the principal surface of the substrate so as to be accommodated in the recessed portion, supplying a sealing resin onto the principal surface of the substrate so as to fill the recessed portion and seal the chip with the sealing resin, and forming a heat dissipation member on the sealing resin.

The above-described or other objects, features, and effects of the present invention will be clarified by the following description of preferred embodiments given below with reference to the accompanying drawings.

BRIEF DESCRIPTION OF THE DRAWINGS

FIG. 4A is an enlarged view of the region IVA shown in FIG. 3.

FIG. 4B is an enlarged view of the region IVB shown in FIG. 3.

FIG. 5 is a flowchart showing an example of a method for manufacturing the electronic component shown in FIG. 1.

FIG. 7A to FIG. 7G are cross sectional views for explaining the flow of FIG. 6.

FIG. 8 is a plan view of an electronic component according to a second preferred embodiment of the present invention.

DETAILED DESCRIPTION OF THE PREFERRED EMBODIMENT

Figure 1:
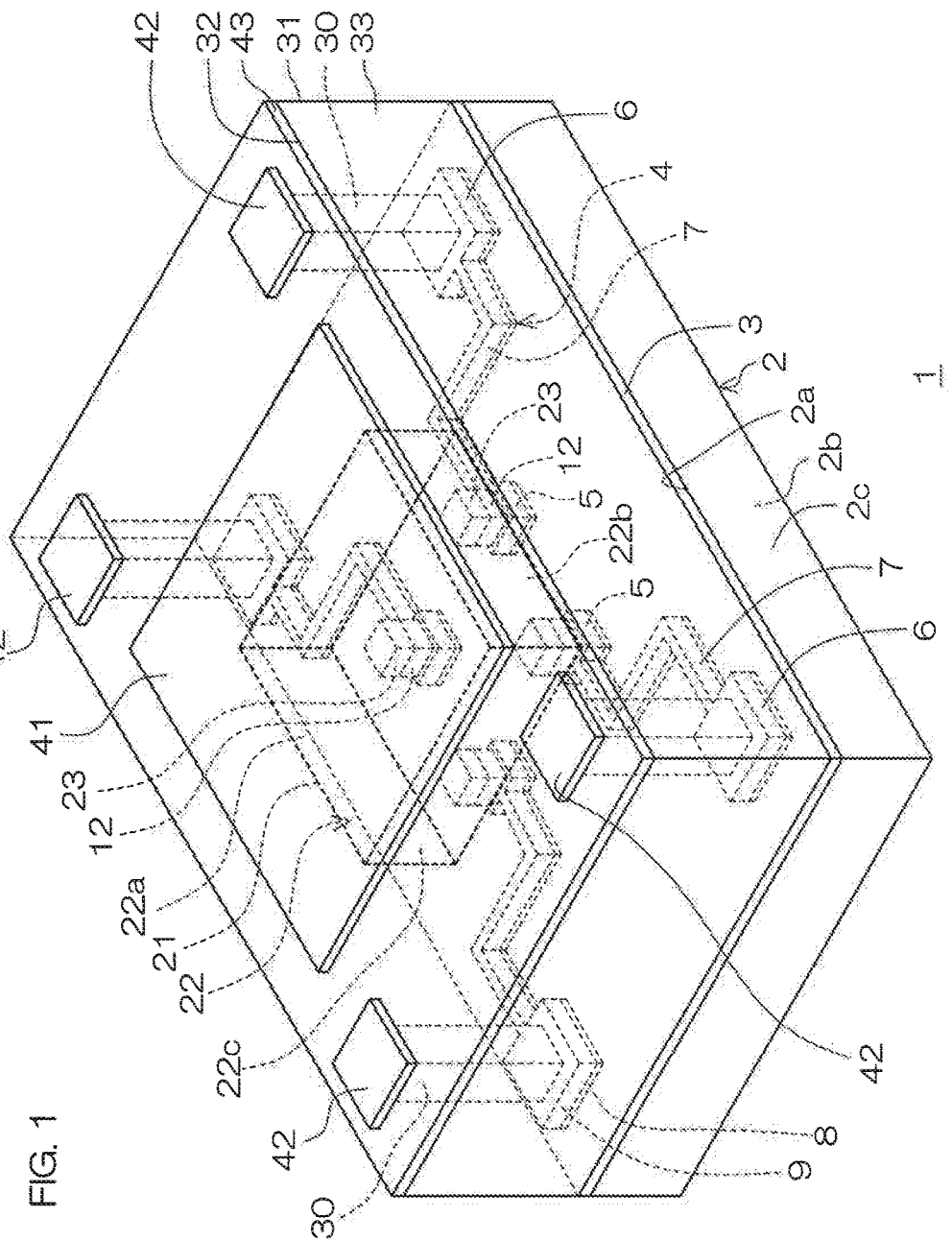
FIG. 1 is a perspective view of an electronic component according to a first preferred embodiment of the present invention.

According to the semiconductor device disclosed in JP2013-197263, a whole of the chip is covered with the sealing resin. Therefore, heat generated at the chip is liable to accumulate inside the sealing resin. As a result, the temperature of the chip rises.

Therefore, one preferred embodiment of the present invention provides an electronic component capable of suppressing a rise in temperature of the chip, and provides a method for manufacturing thereof.

One preferred embodiment of the present invention provides an electronic component including a substrate having a principal surface, a chip arranged at the principal surface of the substrate, a sealing resin sealing the chip on the principal surface of the substrate, and a heat dissipation member formed on the sealing resin.

According to the electronic component, heat generated inside the sealing resin can be dissipated externally via the heat dissipation member formed on the sealing resin. A rise in temperature of the chip can thus be suppressed. The electronic component having high reliability can therefore be provided.

One preferred embodiment of the present invention provides an electronic component including a substrate having a principal surface at which a recessed portion is formed, a chip arranged at the principal surface of the substrate so as to be accommodated in the recessed portion, a sealing resin filling the recessed portion and sealing the chip, and a heat dissipation member formed on the sealing resin.

According to the electronic component, heat generated inside the sealing resin can be dissipated externally via the heat dissipation member formed on the sealing resin. A rise in temperature of the chip can thus be suppressed. The electronic component having high reliability can therefore be provided. Also, according to the electronic component, the chip is accommodated in the recessed portion formed at the principal surface of the substrate. A height of the electronic component can thereby be reduced while improving the heat dissipation property.

One preferred embodiment of the present invention provides a method for manufacturing an electronic component including the steps of preparing a substrate having a principal surface, arranging a chip at the principal surface of the substrate, supplying a sealing resin onto the principal surface of the substrate and sealing the chip with the sealing resin, and forming a heat dissipation member on the sealing resin.

According to the manufacturing method, an electronic component having a structure in which a heat dissipation member is formed on a sealing resin can be manufactured. According to the manufactured electronic component, heat generated inside the sealing resin can therefore be dissipated externally via the heat dissipation member formed on the sealing resin. A rise in temperature of the chip can thus be suppressed. The electronic component having high reliability can therefore be manufactured and provided.

One preferred embodiment of the present invention provides a method for manufacturing an electronic component including the steps of preparing a substrate having a principal surface, forming a recessed portion at the principal surface of the substrate, arranging a chip at the principal surface of the substrate so as to be accommodated in the recessed portion, supplying a sealing resin onto the principal surface of the substrate so as to fill the recessed portion and seal the chip with the sealing resin, and forming a heat dissipation member on the sealing resin.

According to the manufacturing method, an electronic component having a structure in which a heat dissipation member is formed on a sealing resin can be manufactured. According to the manufactured electronic component, heat generated inside the sealing resin can therefore be dissipated externally via the heat dissipation member formed on the sealing resin.

A rise in temperature of the chip can thus be suppressed. The electronic component having high reliability can therefore be manufactured and provided. Also, according to the manufacturing method, the chip is accommodated in the recessed portion formed at the principal surface of the substrate. A height of the electronic component can thereby be reduced while improving the heat dissipation property.

Preferred embodiments of the present invention will hereinafter be described in detail with reference to the accompanying drawings.

Figure 2:
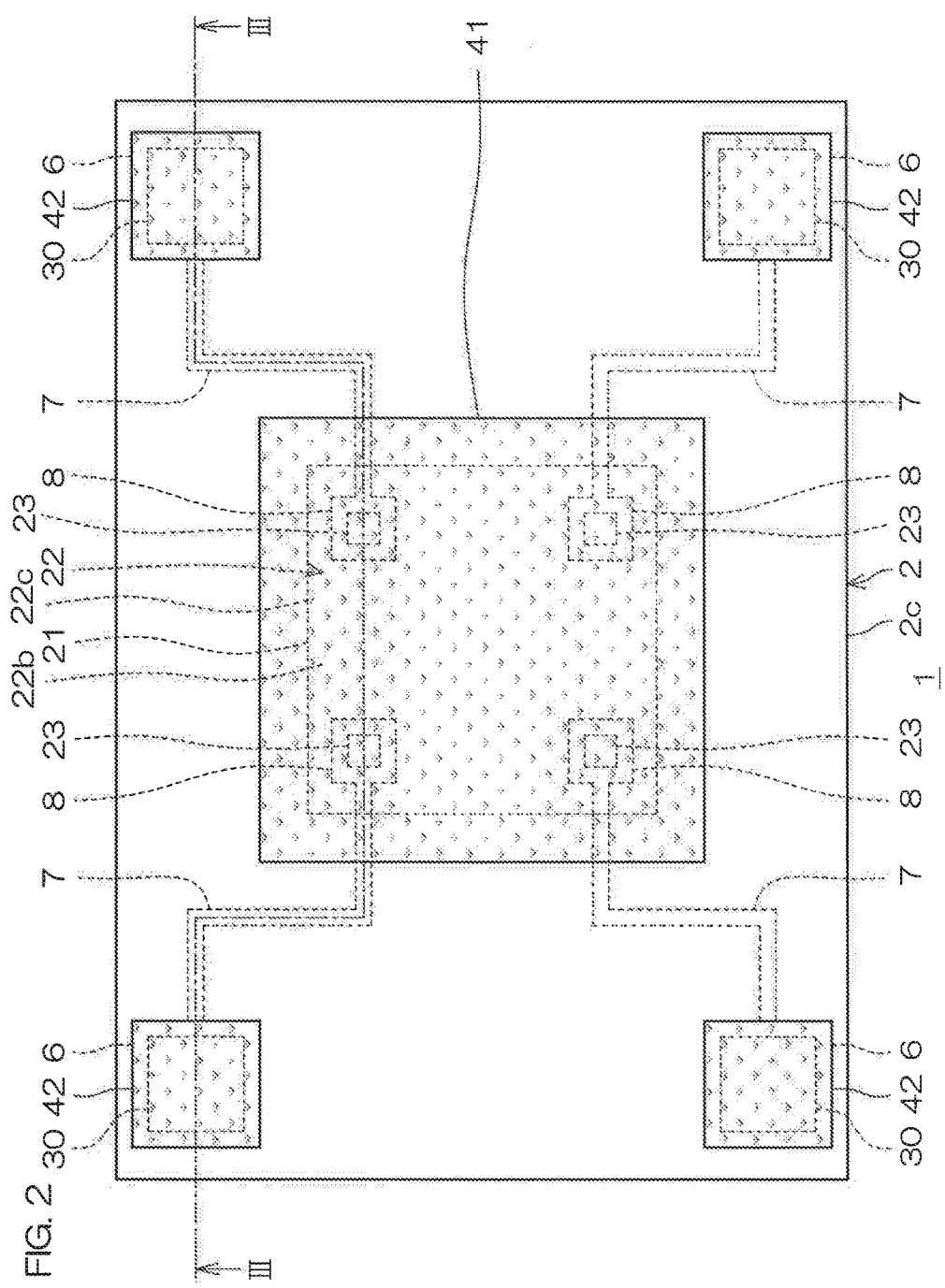
FIG. 2 is a plan view of the electronic component shown in FIG. 1.
Figure 3:
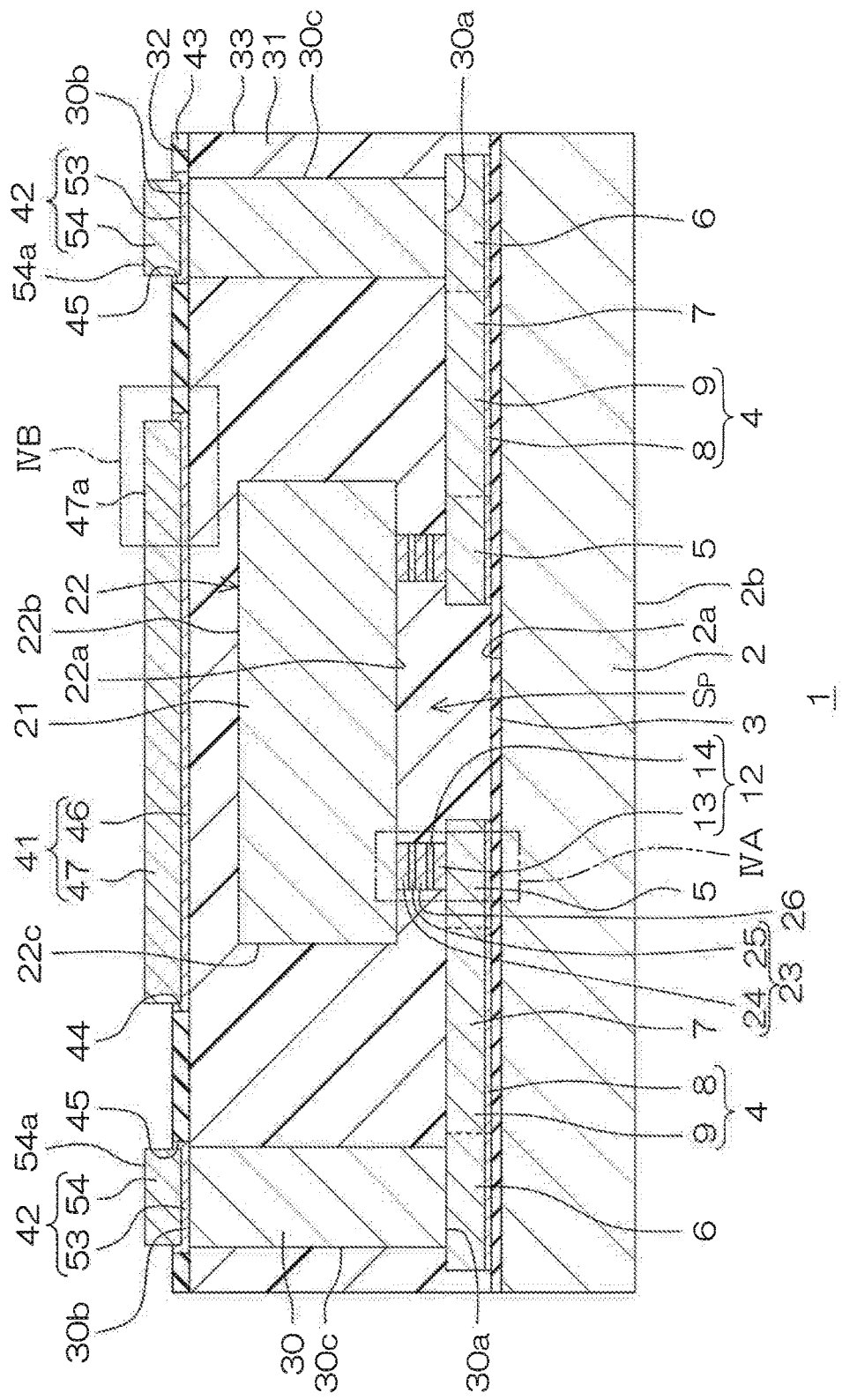
FIG. 3 is a cross sectional view taken along line III-III shown in FIG. 2.

FIG. 1 is a perspective view of an electronic component 1 according to a first preferred embodiment of the present invention. FIG. 2 is a plan view of the electronic component 1 shown in FIG. 1. FIG. 3 is a cross sectional view taken along line III-III shown in FIG. 2. FIG. 4A is an enlarged view of the region IVA shown in FIG. 3. FIG. 4B is an enlarged view of the region IVB shown in FIG. 3.

The electronic component 1 includes an interposer 2 as a substrate for pitch conversion. The interposer 2 has a first principal surface 2a, a second principal surface 2b on a side opposite to the first principal surface 2a, and side surfaces 2c connecting the first principal surface 2a and the second principal surface 2b.

The first principal surface 2a and the second principal surface 2b of the interposer 2 are each formed in a quadrilateral shape (rectangular shape in the preferred embodiment) in the plan view as viewed from normal directions thereof (hereinafter referred to simply as "the plan view"). The first principal surface 2a and the second principal surface 2b of the interposer 2 have flat surfaces parallel to each other.

The interposer 2 may include silicon. The interposer 2 may include an organic insulating material or an inorganic insulating material instead of silicon. The organic insulating material may include epoxy resin, polyimide resin, acrylic resin, or the like. The inorganic insulating material may include glass, ceramic, or the like.

A surface insulating film 3 is formed on the first principal surface 2a of the interposer 2. The surface insulating film 3 covers an entire region of the first principal surface 2a of the interposer 2. The surface insulating film 3 may include a nitride film (an SiN film) or an oxide film (an $SiO_2$ film). In a case where the interposer 2 is composed of the insulating material, the surface insulating film 3 may be omitted.

A wiring film 4 is formed on the surface insulating film 3. The wiring film 4 includes a plurality of (four in the preferred embodiment) first electrode pad films 5, a plurality of (four in the preferred embodiment) second electrode pad films 6, and a plurality of (four in the preferred embodiment) connection electrode films 7.

The plurality of first electrode pad films 5 are formed in a central portion of the first principal surface 2a of the interposer 2. The plurality of first electrode pad films 5 are formed so as to be spaced from each other along two of the side surfaces 2c orthogonal to each other in the interposer 2. The plurality of first electrode pad films 5 are arranged in a matrix pattern. The first electrode pad films 5 are each formed in a quadrilateral shape in the plan view.

The plurality of second electrode pad films 6 are formed in a peripheral portion of the first principal surface 2a of the interposer 2. The plurality of second electrode pad films 6 are formed one by one at the four corners of the interposer 2 in the plan view. The second electrode pad films 6 are each formed in a quadrilateral shape in the plan view.

The plurality of connection electrode films 7 each connect the corresponding first electrode pad film 5 and the corresponding second electrode pad film 6. The connection electrode film 7 is laid around a region between the corresponding first electrode pad film 5 and the corresponding second electrode pad film 6.

Referring to FIG. 3 to FIG. 4A, the wiring film 4 has a laminated structure including a seed layer 8 and a conductor layer 9 laminated in this order from the first principal surface 2a of the interposer 2.

The seed layer 8 has a laminated structure including a Ti film 10 and a Cu film 11 laminated in this order from the interposer 2. The conductor layer 9 has a single layer structure including Cu. The conductor layer 9 may be formed integrally with the Cu film 11 of the seed layer 8. A thickness of the conductor layer 9 is greater than a thickness of the seed layer 8. A resistance value of the wiring film 4 can be reduced by the conductor layer 9 can reduce.

Referring to FIG. 1 to FIG. 3, a plurality of protruding electrodes 12 are formed on the plurality of first electrode pad films 5, respectively. The plurality of protruding electrodes 12 are formed in a block shape or a column shape.

Referring to FIG. 3 to FIG. 4A, the protruding electrodes 12 each have a laminated structure including a main portion 13 and a barrier film 14 laminated in this order from the first electrode pad film 5. The main portion 13 of the protruding electrode 12 may include Cu. The barrier film 14 of the protruding electrode 12 may include Ni.

The protruding electrode 12 has an aspect ratio T/W set equal to or lower than 1 (T/W≤1). The aspect ratio T/W is defined as a ratio of a height T of the protruding electrode 12 with respect to a width W of the protruding electrode 12. In a case where the aspect ratio T/W is equal to or lower than 1, the protruding electrode 12 can be formed on the first electrode pad film 5 in a balanced manner.

A chip 21 is arranged at the first principal surface 2a of the interposer 2. The chip 21 includes a chip body 22 formed in a rectangular parallelepiped shape. The chip body 22 has a mounting surface 22a, a non-mounting surface 22b positioned on a side opposite to the mounting surface 22a, and chip side surfaces 22c connecting the mounting surface 22a and the non-mounting surface 22b.

The chip body 22 may include silicon, GaAs (gallium arsenide), glass, or ceramic. The chip body 22 includes a functional element. The functional element is also a functional device. The functional device, that is the functional element, may include at least one of a resistor, a capacitor, a coil, a diode, or a transistor.

A plurality of (four in the preferred embodiment) terminal electrodes 23 electrically connected to the functional element are formed on the mounting surface 22a of the chip body 22. The non-mounting surface 22b of the chip body 22 is free of any electrodes.

Referring to FIG. 3 to FIG. 4A, the plurality of terminal electrodes 23 each have a laminated structure including a main portion 24 and a barrier film 25 laminated in this order from the mounting surface 22a of the chip body 22. The main portion 24 of the terminal electrode 23 may include Cu. The barrier film 25 of the terminal electrode 23 may include Ni.

The mounting surface 22a of the chip body 22 may be covered with an insulating layer. A wiring layer including wirings that electrically connect the terminal electrodes 23 and the functional element may be formed in the insulating layer. The plurality of terminal electrodes 23 may protrude outwardly from the insulating layer.

Referring to FIG. 1 to FIG. 3, the chip 21 is arranged at the first principal surface 2a of the interposer 2 in a posture in which the mounting surface 22a faces the first principal surface 2a of the interposer 2. The terminal electrodes 23 of the chip 21 are connected to the corresponding protruding electrodes 12 via conductive bonding materials 26, respectively.

The conductive bonding material 26 may be a solder. The diffusion of the solder into the main portion 13 of each protruding electrode 12 is suppressed by the barrier film 14 of the protruding electrode 12. The diffusion of the solder into the main portion 24 of each terminal electrode 23 is suppressed by the barrier film 25 of the terminal electrode 23.

The conductive bonding material 26 may be a metallic paste instead of the solder. The metallic paste may include gold, silver, or the like. The terminal electrodes 23 of the chip 21 may be directly connected to the corresponding protruding electrodes 12 by, for example, a known ultrasonic jointing method, respectively.

Referring to FIG. 1 to FIG. 3, a plurality of pillar electrodes 30 are formed on the plurality of second electrode pad films 6, respectively. The plurality of pillar electrodes 30 are formed in a block shape or a column shape. The plurality of pillar electrodes 30 each have an end surface 30a connected to the corresponding second electrode pad film 6, an opposite end surface 30b positioned on a side opposite to the end surface 30a, and side surfaces 30c connecting the end surface 30a and the opposite end surface 30b.

In a region between the first principal surface 2a of the interposer 2 and the mounting surface 22a of the chip body 22, a space Sp having a predetermined height is formed by the protruding electrodes 12 and the terminal electrodes 23.

A sealing resin 31 is formed on the first principal surface 2a of the interposer 2 and seals the chip 21. The sealing resin 31 may include epoxy resin, polyimide resin, or acrylic resin.

The sealing resin 31 covers an outer surface of the chip 21 and exposes the opposite end surface 30b of each pillar electrode 30. More specifically, the sealing resin 31 fills the space Sp and covers the mounting surface 22a, the non-mounting surface 22b, and the chip side surfaces 22c of the chip 21. The sealing resin 31 further covers the entire region of the side surfaces 30c of each pillar electrode 30.

The sealing resin 31 has a resin principal surface 32 and a resin side surface 33. The resin principal surface 32 of the sealing resin 31 is opposed to the first principal surface 2a of the interposer 2 across the chip 21. The resin principal surface 32 of the sealing resin 31 is formed so as to be flush with respect to the opposite end surface 30b of each pillar electrode 30. The resin principal surface 32 of the sealing resin 31 is connected to the opposite end surface 30b of each pillar electrode 30 without differences in level.

The resin side surface 33 of the sealing resin 31 extends from the periphery of the resin principal surface 32 toward the side surfaces 2c of the interposer 2. The resin side surface 33 of the sealing resin 31 is formed so as to be flush with respect to the side surfaces 2c of the interposer 2. The resin side surface 33 of the sealing resin 31 is connected to the side surfaces 2c of the interposer 2 without differences in level.

Referring to FIG. 1 to FIG. 3, a heat dissipation member 41 and a plurality of (four in the preferred embodiment) external terminals 42 are formed on the resin principal surface 32 of the sealing resin 31. The heat dissipation member 41 is provided to externally dissipate heat generated inside the sealing resin 31.

In FIG. 2, the heat dissipation member 41 and the external terminals 42 are hatched for clarity. The structure of the heat dissipation member 41, the structure of the external terminals 42, and their surrounding structures will hereinafter be specifically described.

An insulating film 43 is formed on the resin principal surface 32 of the sealing resin 31. The insulating film 43 has a first opening 44 and a plurality of second openings 45.

The first opening 44 of the insulating film 43 exposes a region facing the non-mounting surface 22b of the chip 21 in the resin principal surface 32 of the sealing resin 31. The first opening 44 has an opening area greater than an area of the chip 21 in the plan view. An inner wall surface of the first opening 44 surrounds a periphery of the chip 21 in the plan view.

The plurality of second openings 45 of the insulating film 43 expose the opposite end surfaces 30b of the pillar electrodes 30, respectively. The plurality of second openings 45 each have an opening area greater than an area of the opposite end surfaces 30b of the pillar electrodes 30 in the plan view. Inner wall surfaces of the plurality of second openings 45 each surround a periphery of each opposite end surface 30b of each pillar electrode 30 in the plan view.

The heat dissipation member 41 is formed on an exposed surface of the sealing resin 31 (the resin principal surface 32 of the sealing resin 31) exposed from the first opening 44. The heat dissipation member 41 is electrically insulated from the external terminals 42.

The heat dissipation member 41 is opposed to the chip 21 across the sealing resin 31. More specifically, the heat dissipation member 41 is opposed to the entire non-mounting surface 22b of the chip 21 across the sealing resin 31. The heat dissipation member 41 has an area greater than an area of the chip 21 in the plan view.

Referring to FIG. 3 to FIG. 4B, the heat dissipation member 41 includes a seed layer 46 and a metallic layer 47. The seed layer 46 is formed on the exposed surface of the sealing resin 31. The metallic layer 47 is formed on the seed layer 46.

More specifically, a surface of the sealing resin 31 side and an opposite surface thereof in the seed layer 46 are formed along the exposed surface of the sealing resin 31 and an inner wall surface of the insulating film 43 defining the first opening 44. The seed layer 46 has a laminated structure including a Ti film 48 and a Cu film 49 laminated in this order from the sealing resin 31. The seed layer 46 defines a recessed space in the first opening 44.

More specifically, the metallic layer 47 is formed inside the recessed space defined by the seed layer 46. The metallic layer 47 has an upper end portion 47a protruding upward from the surface of the insulating film 43. The metallic layer 47 includes a portion positioned in an inside region of the first opening 44 and a portion positioned in an outside region of the first opening 44.

The metallic layer 47 has a laminated structure including an Ni film 50, a Pd film 51, and an Au film 52 laminated in this order from the seed layer 46. The Ni film 50 is formed across the inside region of the first opening 44 and the outside region of the first opening 44.

The Pd film 51 and the Au film 52 cover the Ni film 50 in the outside region of the first opening 44. A thickness of the Pd film 51 and a thickness of the Au film 52 are smaller than a thickness of the Ni film 50, respectively.

A periphery of the metallic layer 47 is positioned in a region inside the inner wall surface of the first opening 44. A portion of the seed layer 46 interposes in a region between the inner wall surface of the first opening 44 and the periphery of the metallic layer 47. In the region between the inner wall surface of the first opening 44 and the periphery of the metallic layer 47, an upper end portion of the seed layer 46 may be positioned closer to the resin principal surface 32 of the sealing resin 31 than the surface of the insulating film 43.

Referring to FIG. 3, each of the external terminals 42 is formed on the opposite end surface 30b of each pillar electrode 30 exposed from each second opening 45. Each of the external terminals 42 is electrically connected to each pillar electrode 30 inside each second opening 45.

Each of the external terminals 42 is opposed to the entire region of the opposite end surface 30b of the respective pillar electrodes 30. Each of the external terminals 42 has an area greater than an area of the opposite end surface 30b of the pillar electrode 30 in the plan view. Each of the external terminals 42 overlaps the sealing resin 31.

Each of the external terminals 42 includes a seed layer 53 and a metallic layer 54. The seed layer 53 is formed on the opposite end surface 30b of the pillar electrode 30. The metallic layer 54 is formed on the seed layer 53.

More specifically, a surface of the sealing resin 31 side and an opposite surface thereof in the seed layer 53 are formed along the opposite end surface 30b of each pillar electrode 30 and the inner wall surface of the insulating film 43 defining the second opening 45. The seed layer 53 defines a recessed space inside the second opening 45.

More specifically, the metallic layer 54 is formed inside the recessed space that is defined by the seed layer 53. The metallic layer 54 has an upper end portion 54a protruding upward from the surface of the insulating film 43. The metallic layer 54 includes a portion positioned in an inside region of the second opening 45 and a portion positioned in an outside region of the second opening 45.

A periphery of the metallic layer 54 is positioned in a region inside the inner wall surface of the second opening 45. A portion of the seed layer 53 interposes in a region between the inner wall surface of the second opening 45 and the periphery of the metallic layer 54. In the region between the inner wall surface of the second opening 45 and the periphery of the metallic layer 54, an upper end portion of the seed layer 53 may be positioned closer to the resin principal surface 32 of the sealing resin 31 than the surface of the insulating film 43.

As not shown, the seed layer 53 of each external terminal 42 has a laminated structure including a Ti film 48 and a Cu film 49, likewise the seed layer 46 of the heat dissipation member 41 (see also FIG. 4B). The metallic layer 54 of each external terminal 42 has a laminated structure including an Ni film 50, a Pd film 51, and an Au film 52 as well, likewise the metallic layer 47 of the heat dissipation member 41 (see also FIG. 4B).

As described above, according to the electronic component 1, a pitch of the terminal electrodes 23 of the chip 21 is converted to a pitch of the external terminals 42 via the wiring film 4, the protruding electrodes 12, the pillar electrodes 30, etc. According to the electronic component 1, the heat dissipation member 41 is formed on the sealing resin 31.

The heat dissipation member 41 is opposed to the chip 21 across the sealing resin 31. The heat dissipation member 41 is opposed to the entire region of the non-mounting surface 22b of the chip body 22 in the plan view. The heat dissipation member 41 has the area greater than the area of the chip 21 in the plan view.

Further, the heat dissipation member 41 is formed of metal, a thermal conductivity of which is higher than a thermal conductivity of the sealing resin 31. Heat generated inside the sealing resin 31 can therefore be appropriately dissipated externally via the heat dissipation member 41. A rise of the temperature inside the sealing resin 31 and a rise of the temperature in the chip 21 can thereby be appropriately suppressed. The electronic component 1 having high reliability can therefore be provided.

Further, according to the electronic component 1, the heat dissipation member 41 and the external terminals 42 have approximately the same configuration. The heat dissipation member 41 and the external terminals 42 can thereby be formed through the same processes. An increase in man-hours in processes of manufacturing the electronic component 1 can thus be avoided.

Furthermore, according to the electronic component 1, the space Sp having the height sufficient to be filled with the sealing resin 31 is formed in the region between the first principal surface 2a of the interposer 2 and the mounting surface 22a of the chip body 22. The space Sp can be filled successfully with the sealing resin 31 in the region between the first principal surface 2a of the interposer 2 and the mounting surface 22a of the chip body 22.

The formation of voids (holes) can therefore be suppressed in the sealing resin 31 filled in the space Sp. As a result, the entire region of the outer surfaces of the connecting electrodes 16, the terminal electrodes 23, and the conductive bonding material 26 can be successfully covered with the sealing resin 31. The corrosion of the protruding electrodes 12, the terminal electrodes 23, and the conductive bonding material 26 due to moisture retained in the voids (holes) can thereby be suppressed.

Next, a method for manufacturing the electronic component 1 will be described with reference to FIG. 5. FIG. 5 is a flowchart showing an example of a method for manufacturing the electronic component 1 shown in FIG. 1. Hereinafter, FIG. 1 to FIG. 4B are also referred.

In manufacturing the electronic component 1, the interposer 2 having the first principal surface 2a and the second principal surface 2b is prepared (step S1). The interposer 2 may be made of silicon.

Next, the surface insulating film 3 is formed on the first principal surface 2a of the interposer 2 (step S2). The surface insulating film 3 may be an $SiO_2$ film. The surface insulating film 3 may be formed by a Chemical Vapor Deposition (CVD) method or a thermal oxidation treatment.

Next, the wiring film 4 is formed on the surface insulating film 3 (step S3). In this step, the seed layer 8 including the Ti film 10 and the Cu film 11 is first formed. The Ti film 10 and the Cu film 11 may be formed by a sputtering method. In the sputtering method, Ti and Cu are deposited in this order on the surface insulating film 3.

Next, the conductor layer 9 is formed on the seed layer 8. The conductor layer 9 may be formed by an electrolytic copper plating method. Next, a mask having a predetermined pattern is formed on the conductor layer 9. The mask has an opening formed in a pattern corresponding to the wiring film 4.

Next, unnecessary portions of the conductor layer 9 and the seed layer 8 are removed by, for example, an etching method via the mask. The wiring film 4 including the first electrode pad films 5, the second electrode pad films 6, and the connection electrode films 7 is thereby formed. Thereafter, the mask is removed.

The wiring film 4 may also be formed through the following steps. First, the seed layer 8 including the Ti film 10 and the Cu film 11 is first formed. The Ti film 10 and the Cu film 11 may be formed by a sputtering method. In the sputtering method, Ti and Cu are deposited in this order on the surface insulating film 3.

Next, a mask having a predetermined pattern is formed on the seed layer 8. The mask has an opening formed in a pattern corresponding to the wiring film 4. Next, the conductor layer 9 is formed on the seed layer 8 exposed from the opening of the mask. The conductor layer 9 may be formed by an electrolytic copper plating method.

Next, the mask is removed. Next, unnecessary portions of the seed layer 8 exposed from the conductor layer 9 are removed by, for example, an etching method. The wiring film 4 including the first electrode pad films 5, the second electrode pad films 6, and the connection electrode films 7 is thereby formed.

Next, the protruding electrodes 12 are formed on the first electrode pad films 5 of the wiring film 4 (step S4). In this step, first, a mask having a predetermined pattern is formed on the surface insulating film 3. The mask selectively has openings exposing the first electrode pad films 5 of the wiring film 4.

Next, the main portions 13 of the protruding electrodes 12 are formed on the respective first electrode pad films 5 exposed from the openings of the mask. The main portions 13 may be formed by an electrolytic copper plating method. Next, the barrier films 14 of the protruding electrodes 12 are formed on the respective main portions 13 exposed from the openings of the mask. The barrier films 14 may be formed by an electrolytic copper plating method.

The protruding electrodes 12 having the laminated structure including the main portion 13 and the barrier film 14 are thereby formed. Thereafter, the mask is removed.

Next, the pillar electrodes 30 are formed on the second electrode pad films 6 of the wiring film 4 (step S5). In this step, first, a mask having a predetermined pattern is formed on the surface insulating film 3. The mask selectively has openings exposing the second electrode pad films 6 of the wiring film 4.

Next, pillar electrodes 30 are formed on the respective second electrode pad films 6 exposed from the openings of the mask. The pillar electrodes 30 may be formed by an electrolytic copper plating method. The pillar electrodes 30 of a block shape or a column shape are thereby formed.

Next, the chip 21 is arranged at the first principal surface 2a of the interposer 2 (step S6). The chip 21 is arranged at the first principal surface 2a of the interposer 2 in a posture in which the mounting surface 22a faces the first principal surface 2a of the interposer 2. The terminal electrodes 23 of the chip 21 are connected to the corresponding protruding electrodes 12 via conductive bonding material 26, respectively.

Next, the sealing resin 31 is supplied onto the first principal surface 2a of the interposer 2 (step S7). The chip 21 is thereby sealed with the sealing resin 31. The entire region of the outer surface of the chip 21 and the entire region of the outer surfaces of the pillar electrodes 30 are covered with the sealing resin 31.

Next, the resin principal surface 32 of the sealing resin 31 is ground (step S8). The sealing resin 31 is ground until the opposite end surfaces 30b of the pillar electrodes 30 are exposed. The opposite end surfaces 30b of the pillar electrodes 30 is thereby formed so as to be flush with respect to the resin principal surface 32 of the sealing resin 31.

Next, the heat dissipation member 41 and the external terminals 42 are formed on the resin principal surface 32 of the sealing resin 31 (step S9). Hereinafter, the steps of forming the heat dissipation member 41 and the external terminals 42 will be specifically described with reference to FIG. 6 and FIG. 7A to FIG. 7G.

Figure 6:
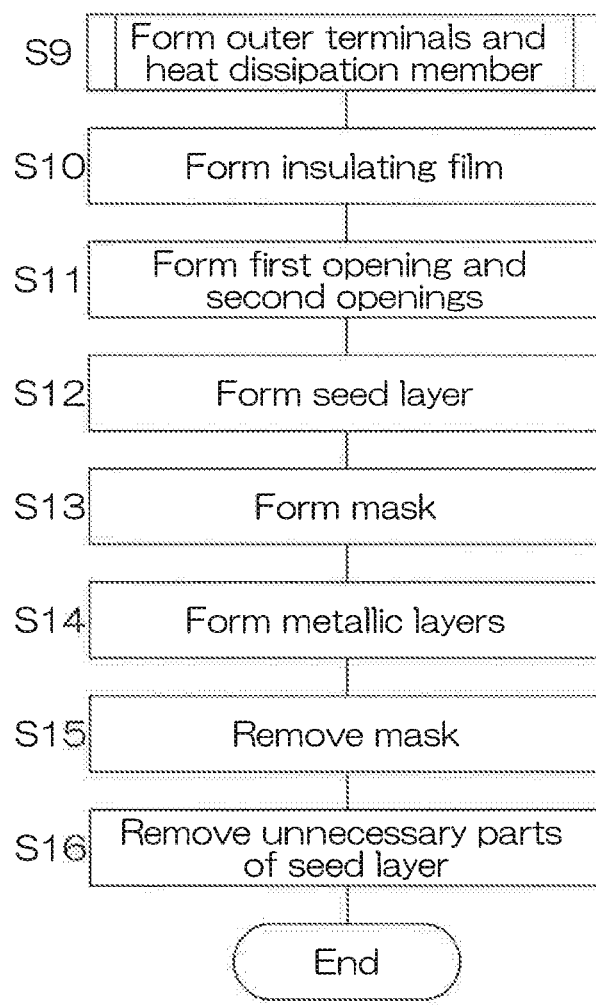
FIG. 6 is a flowchart for explaining the step S9 shown in FIG. 5.

FIG. 6 is a flowchart for explaining the step S9 shown in FIG. 5. FIG. 7A to FIG. 7G are cross sectional views for explaining the step S9 shown in FIG. 5.

Figure 7A:
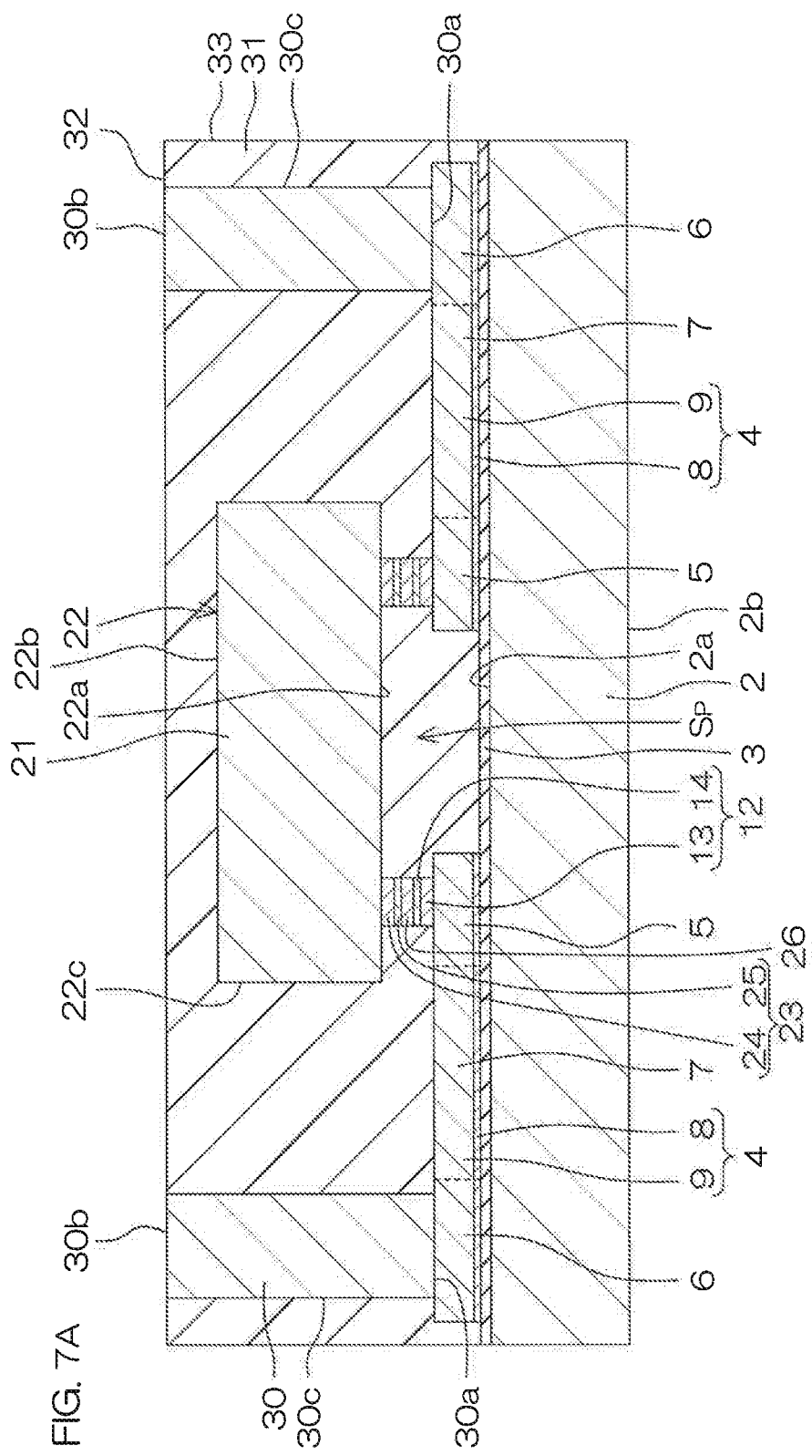

First, referring to FIG. 7A, an intermediate body of the electronic component 1 before the heat dissipation member 41 and the external terminals 42 are formed is prepared.

Figure 7B:
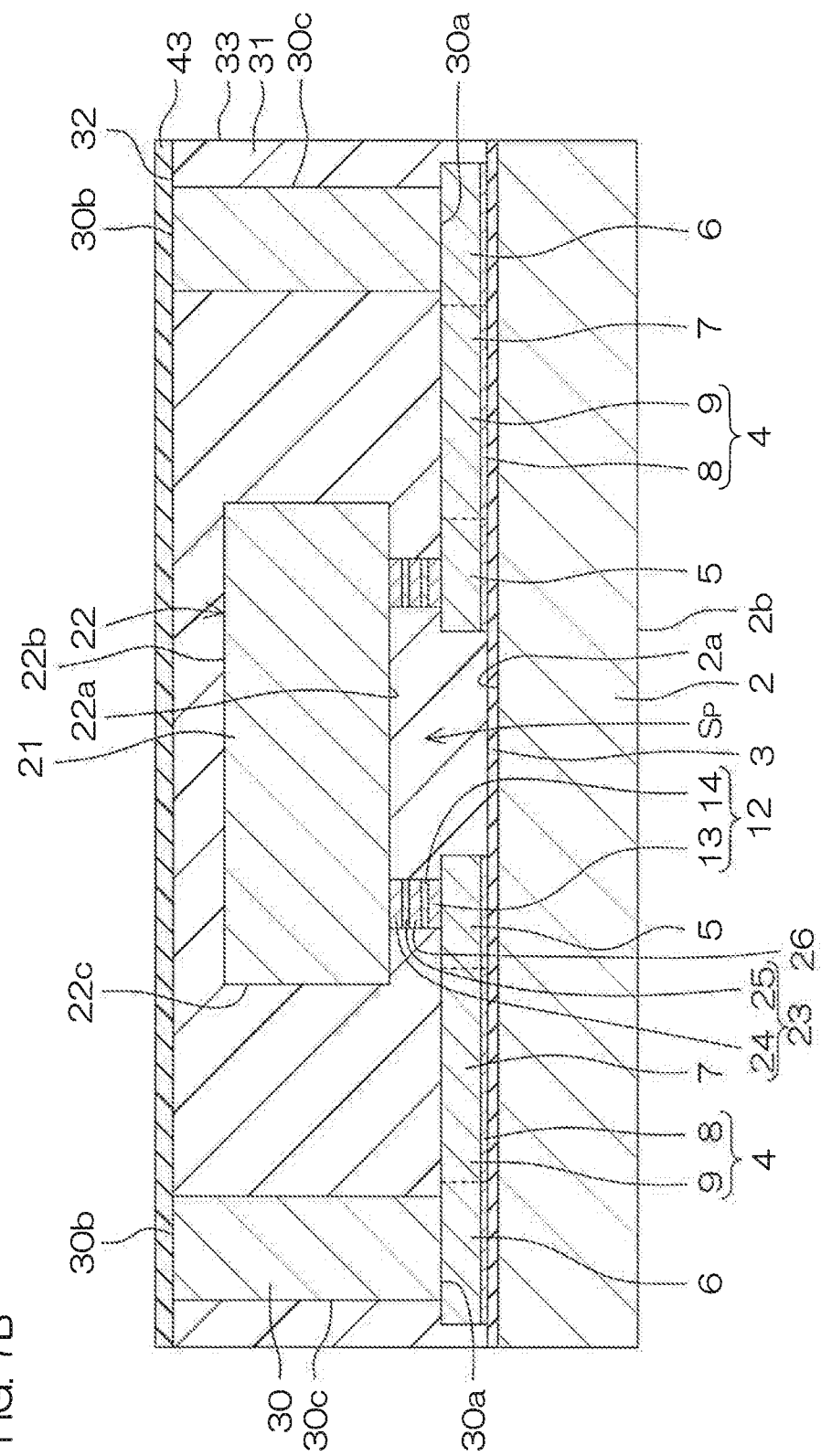

Next, referring to FIG. 7B, the insulating film 43 is formed on the resin principal surface 32 of the sealing resin 31 (step S10). The insulating film 43 covers the entire region of the resin principal surface 32 of the sealing resin 31. The insulating film 43 may be formed by a CVD method.

Next, referring to FIG. 7C, a mask 61 having a predetermined pattern is formed on the insulating film 43 (step S11). The mask 61 selectively has openings 61a exposing regions in which the first opening 44 and the second openings 45 are to be formed.

Next, unnecessary portions of the insulating film 43 exposed from the openings 61a of the mask 61 are removed by, for example, an etching method via the mask 61. The first opening 44 and the second openings 45 are thereby formed in the insulating film 43. The etching method may be a dry etching method.

Figure 7D:
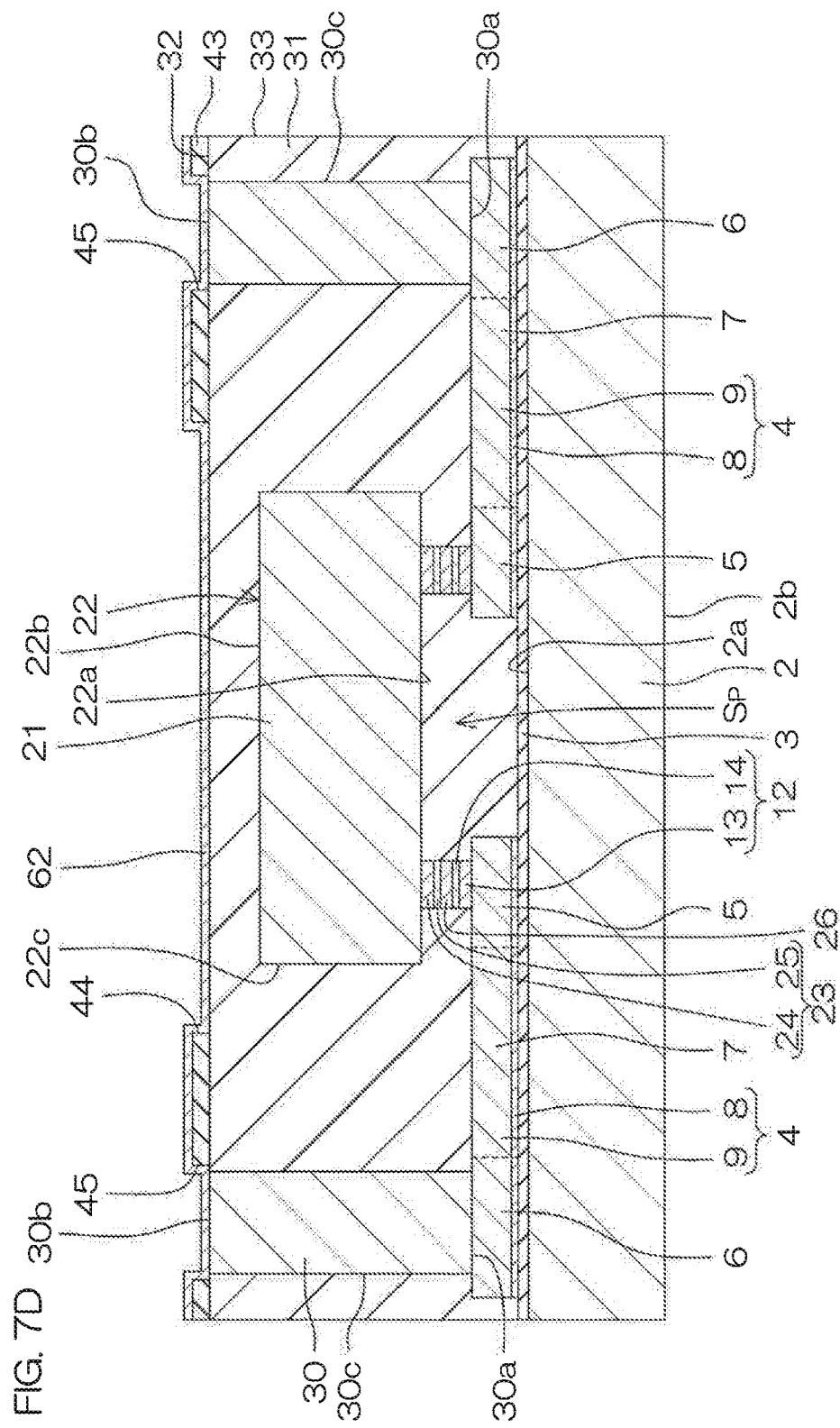

Next, referring to FIG. 7D, a seed layer 62 including the Ti film 48 and the Cu film 49 is formed on the resin principal surface 32 of the sealing resin 31 (step S12). The seed layer 62 is formed as a base of the seed layer 46 of the heat dissipation member 41 and the seed layers 53 of the external terminals 42.

The Ti film 48 and the Cu film 49 may be formed by a sputtering method. In the sputtering method, Ti and Cu are deposited in this order on the resin principal surface 32 of the sealing resin 31.

The seed layer 62 is formed in a film-like along the surface of the insulating film 43 and the resin principal surface 32 of the sealing resin 31. More specifically, the seed layer 62 is formed such that one surface and the other surface thereof along the surface of the insulating film 43, the resin principal surface 32 of the sealing resin 31 exposed from the first opening 44 and the second openings 45, the inner wall surface of the first opening 44, and the inner wall surfaces of the second openings 45.

Next, referring to FIG. 7E, a mask 63 having a predetermined pattern is formed on the seed layer 62 (step S13). The mask 63 selectively has openings 63a in regions in which the metallic layer 47 of the heat dissipation member 41 and the metallic layers 54 of the external terminals 42 are to be formed.

Figure 7F:
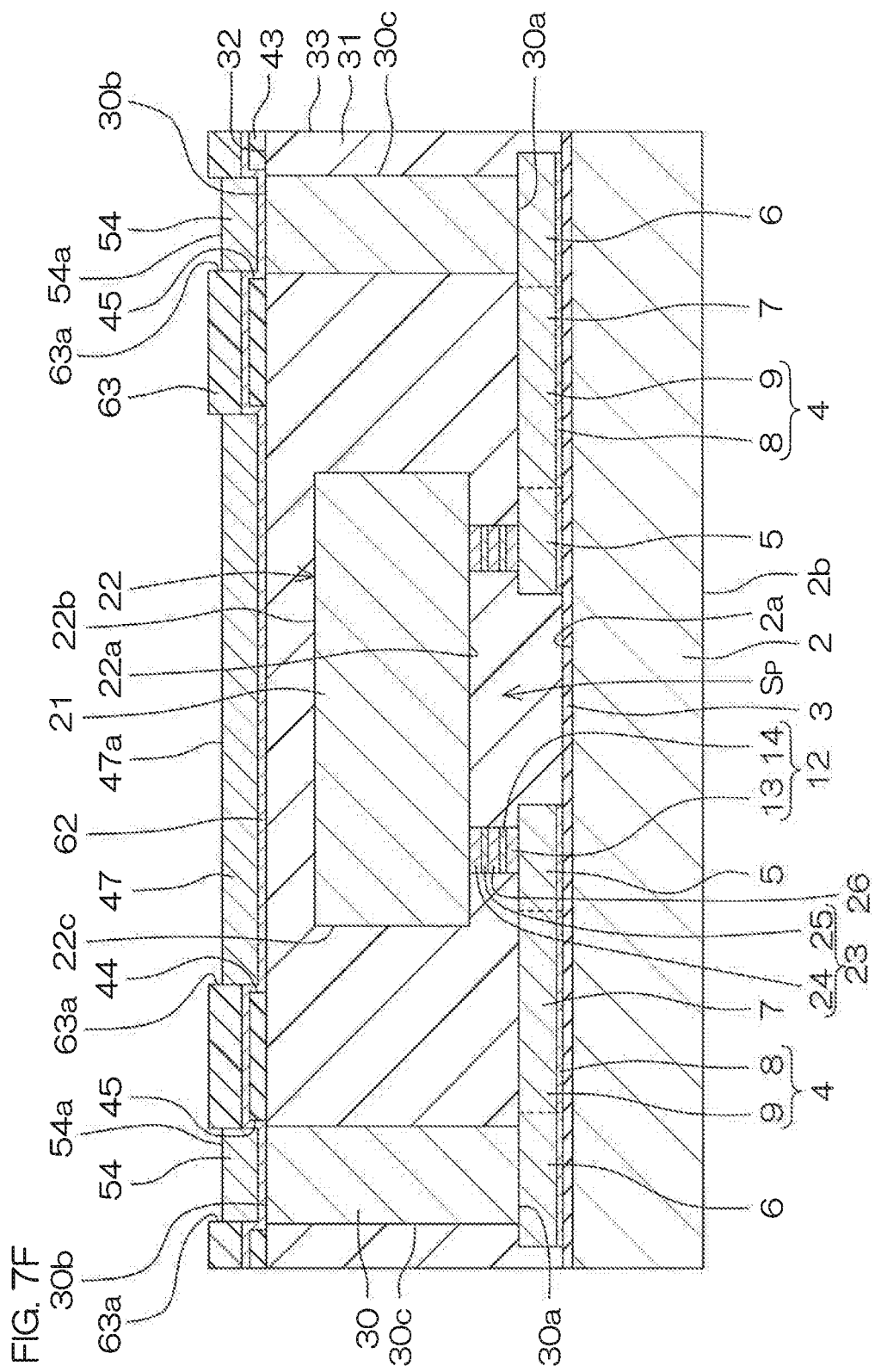

Next, referring to FIG. 7F, the metallic layer 47 of the heat dissipation member 41 and the metallic layers 54 of the external terminals 42 are formed (step S14). In this step, first, the laminated structure including the Ni film 50, the Pd film 51, and the Au film 52 is formed on the seed layer 62 exposed from the openings 63a of the mask 63. The Ni film 50, the Pd film 51, and the Au film 52 may be formed by an electrolytic plating method.

The Ni film 50 is formed along the surface of the seed layer 62 and the inner wall surfaces of the openings 63a of the mask 63. The Pd film 51 and the Au film 52 are formed along the surface of the Ni film 50 and the inner wall surfaces of the openings 63a of the mask 63, respectively.

The metallic layer 47 having the laminated structure including the Ni film 50, the Pd film 51, and the Au film 52 is thereby formed. The metallic layers 54 having the laminated structure including the Ni film 50, the Pd film 51, and the Au film 52 are thereby formed as well.

Figure 7G:
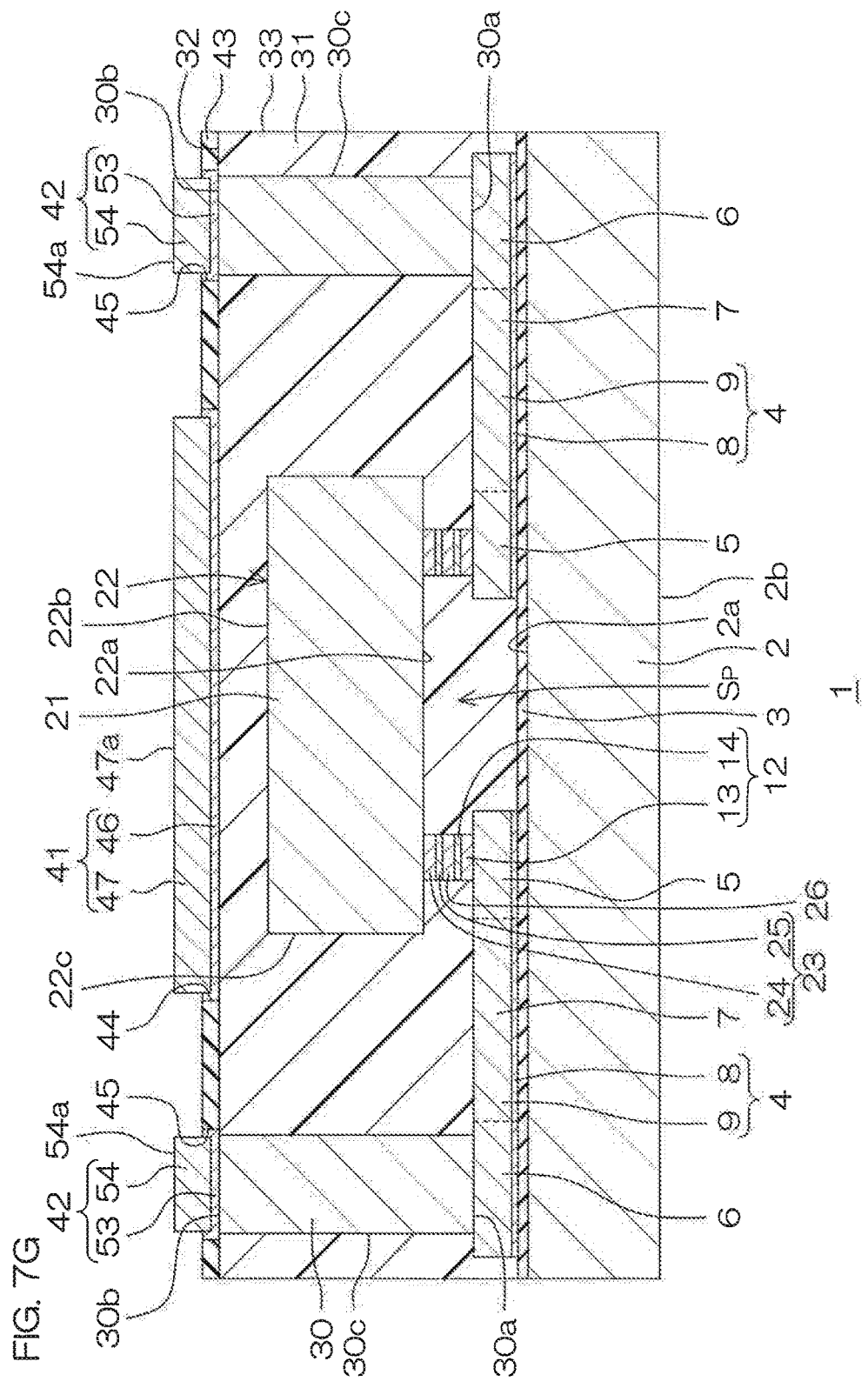

Next, referring to FIG. 7G, the mask 63 is removed (step S15). Next, unnecessary portions of the seed layer 62 exposed from the metallic layer 47 of the heat dissipation member 41 and the metallic layers 54 of the external terminals 42 are removed (step S16).

In this step, unnecessary portions of the seed layer 62 are removed by an etching method using the metallic layer 47 of the heat dissipation member 41 and the metallic layers 54 of the external terminals 42 as masks. The etching method may be a wet etching method.

The seed layer 62 is thereby divided into the seed layer 46 of the heat dissipation member 41 and the seed layers 53 of the external terminals 42. At the same time, the heat dissipation member 41 and the external terminals 42 are electrically insulated. Through the foregoing steps, the electronic component 1 is manufactured.

Figure 9:
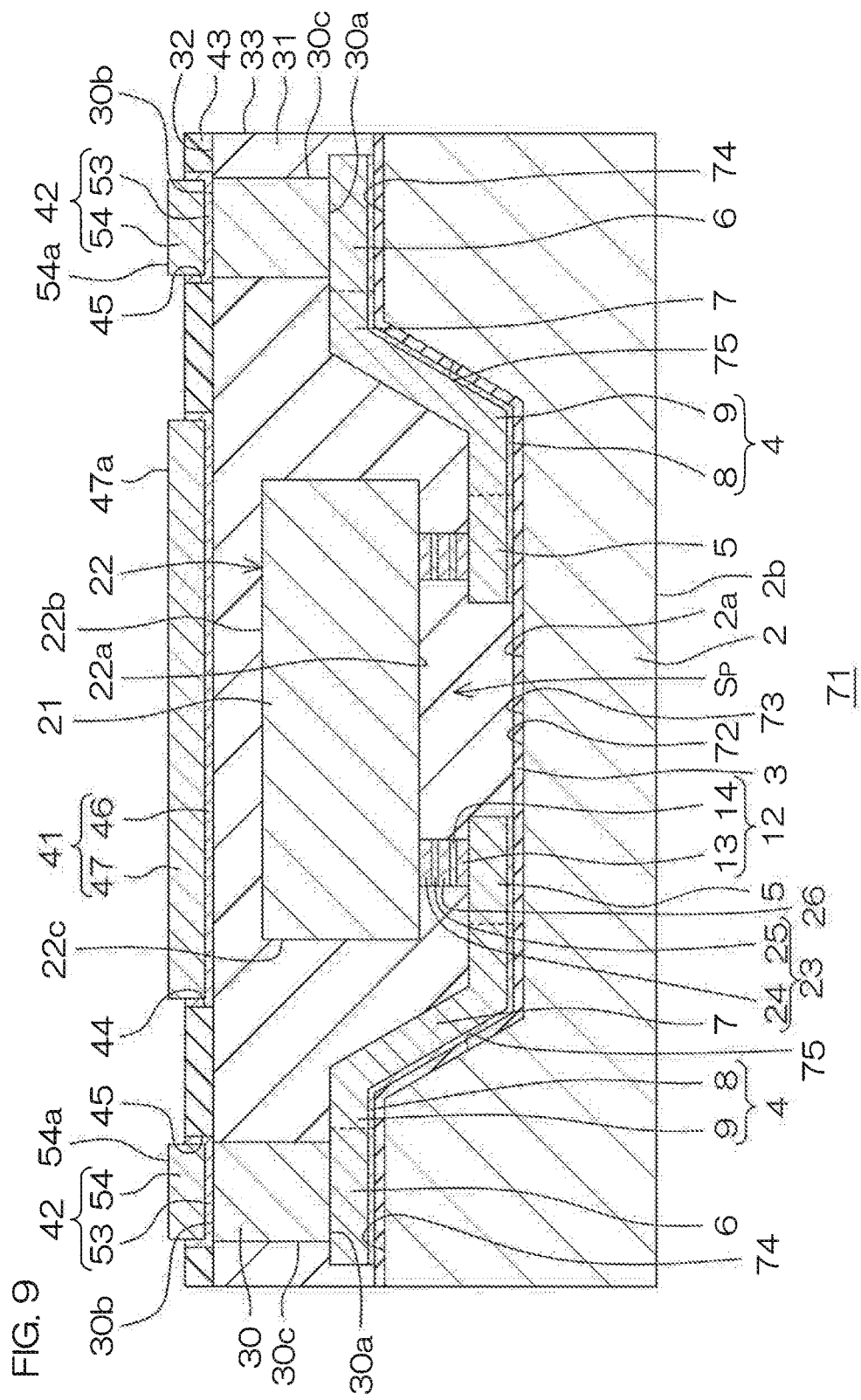
FIG. 9 is a cross sectional view taken along line IX-IX shown in FIG. 8.

FIG. 8 is a plan view of an electronic component 71 according to a second preferred embodiment of the present invention. FIG. 9 is a cross sectional view taken along line IX-IX shown in FIG. 8. In the preferred embodiment, the same reference signs are given to structures corresponding to structures of the first preferred embodiment described above, and descriptions thereof will be omitted. In FIG. 8, the heat dissipation member 41 and the external terminals 42 are hatched for clarity.

Referring to FIG. 8 to FIG. 9, the first principal surface 2a of the interposer 2 has a recessed portion 72 hollowed toward the second principal surface 2b. The second principal surface 2b of the interposer 2 has a flat surface.

The recessed portion 72 is formed in a central portion of the first principal surface 2a of the interposer 2 so as to be spaced inward from the periphery of the interposer 2. The recessed portion 72 is formed in a quadrilateral shape parallel to the sides of the interposer 2 in the plan view.

The recessed portion 72 may be formed in a polygonal shape in the plan view instead of the quadrilateral shape. The recessed portion 72 may be formed in a circular shape or an elliptical shape in the plan view.

The first principal surface 2a of the interposer 2 includes a low region portion 73, a high region portion 74, and a connecting portion 75. The low region portion 73 is formed by a bottom portion of the recessed portion 72. The high region portion 74 is formed by a region surrounding the recessed portion 72. The connecting portion 75 connects the low region portion 73 and the high region portion 74.

The low region portion 73 is formed in a quadrilateral shape parallel to the sides of the interposer 2 in the plan view. The high region portion 74 is formed in a quadrilateral ring shape surrounding the recessed portion 72 in the plan view. The recessed portion 72 is formed in a tapered manner in a cross sectional view in which the opening width gradually narrows from the high region portion 74 to the low region portion 73. Therefore, the connecting portion 75 has a slanted surface slanted downwardly from the high region portion 74 toward the low region portion 73.

The plurality of first electrode pad films 5 are formed in the low region portion 73 of the interposer 2. The plurality of second electrode pad films 6 are formed in the high region portion 74 of the interposer 2. The connection electrode film 7 is laid around from the corresponding first electrode pad film 5 to the corresponding second electrode pad film 6 across the connecting portion 75, in a region between the corresponding first electrode pad film 5 and the corresponding second electrode pad film 6.

The chip 21 is accommodated in the recessed portion 72 of the interposer 2. The chip 21 is electrically connected to the first electrode pad films 5 via the protruding electrodes 12 inside the recessed portion 72.

The chip 21 may be accommodated in the recessed portion 72 such that the mounting surface 22a of the chip body 22 is positioned inside the recessed portion 72, while the non-mounting surface 22b of the chip body 22 is positioned above the high region portion 74. That is, the chip 21 is accommodated in the recessed portion 72 such that the high region portion 74 of the interposer 2 is positioned at a region between the mounting surface 22a of the chip body 22 and the non-mounting surface 22b of the chip body 22.

The chip 21 may be accommodated in the recessed portion 72 such that both the mounting surface 22a and the non-mounting surface 22b of the chip body 22 are positioned in a region between the low region portion 73 and the high region portion 74 of the interposer 2.

That is, the recessed portion 72 may have a depth with which both the mounting surface 22a and the non-mounting surface 22b of the chip body 22 are positioned closer to the low region portion 73 than the high region portion 74, in a state where the chip 21 is accommodated in the recessed portion 72.

The mounting surface 22a and the non-mounting surface 22b of the chip body 22 have an area smaller than an area of the low region portion 73 in the plan view. The entire region of the mounting surface 22a of the chip body 22 may be opposed to the low region portion 73. That is, an entire periphery of the chip body 22 may be positioned in a region surrounded by a periphery of the low region portion 73.

A portion of the mounting surface 22a of the chip body 22 may be opposed to a portion of the connecting portion 75. The mounting surface 22a and the non-mounting surface 22b of the chip body 22 may have an area greater than the area of the low region portion 73 in the plan view, respectively.

The sealing resin 31 fills the recessed portion 72 and seals the chip 21 and the pillar electrodes 30. The heat dissipation member 41 is opposed to the chip 21 across the sealing resin 31. The heat dissipation member 41 is therefore formed in a region immediately above the recessed portion 72.

The step of forming the recessed portion 72 is performed after the step of preparing the interposer 2 (step S1 shown in FIG. 5) and before the step of forming the surface insulating film 3 (step S2 shown in FIG. 5).

In this step, first, a mask having a predetermined pattern is formed on the first principal surface 2a of the interposer 2. The mask selectively has an opening exposing a region in which a recessed portion 72 is to be formed.

Next, an unnecessary portion of the interposer 2 exposed from the opening of the mask is removed by, for example, an etching method via the mask. The etching method may be a wet etching method. Thereafter, the mask is removed. The recessed portion 72 is thereby formed at the first principal surface 2a of the interposer 2.

As described above, according to the electronic component 71, the same effect as the effect described in the first preferred embodiment can be exhibited as well.

According to the electronic component 71, the chip 21 is accommodated in the recessed portion 72. The distance between the second principal surface 2b of the interposer 2 and the non-mounting surface 22b of the chip 21 can thus be reduced by an amount corresponding to the depth of the recessed portion 72. Therefore, a reduction in size of the electronic component 81 due to a reduction in height can thereby be achieved, while improving the heat dissipation property.

Figure 10:
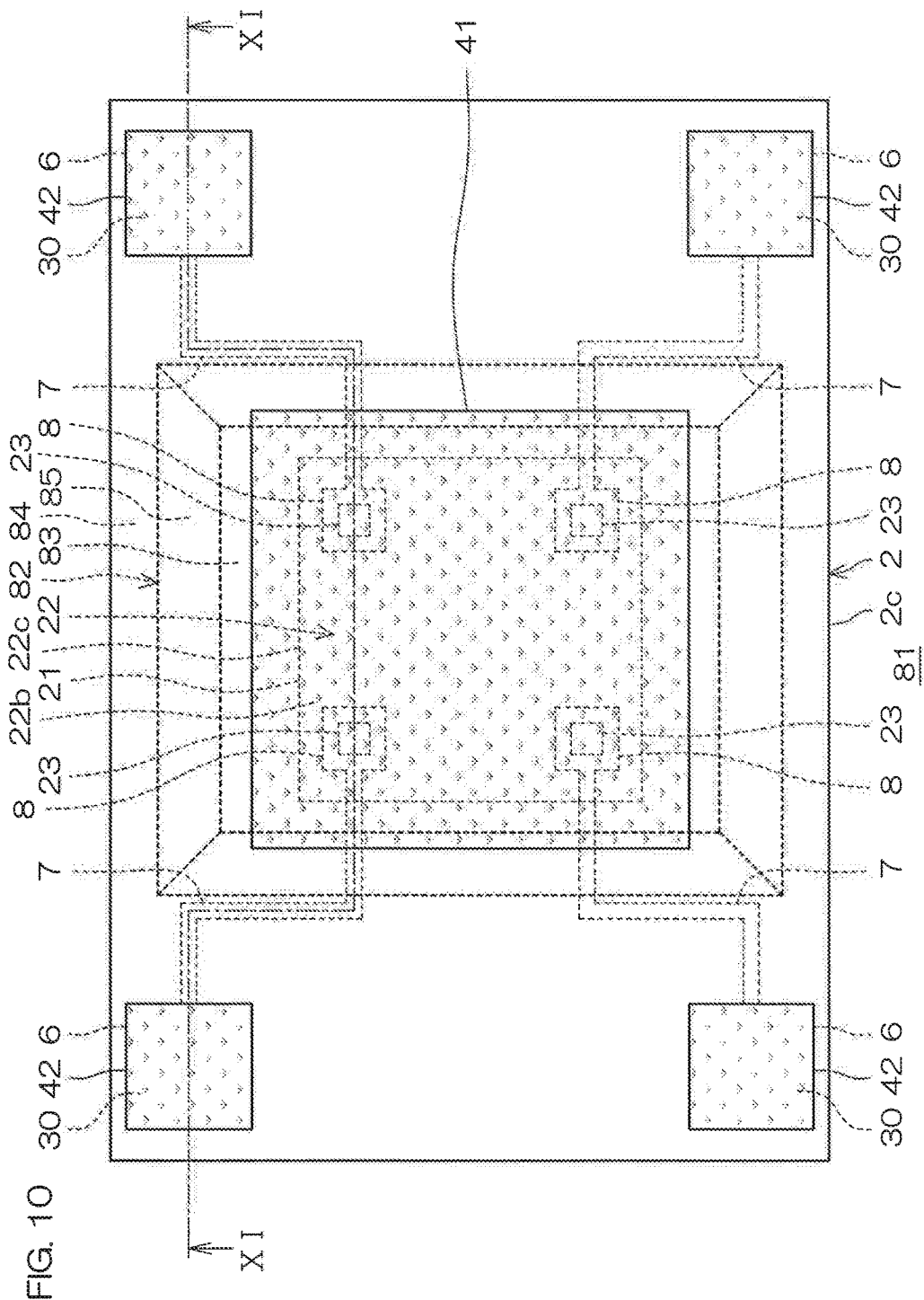
FIG. 10 is a plan view of an electronic component according to a third preferred embodiment of the present invention.
Figure 11:
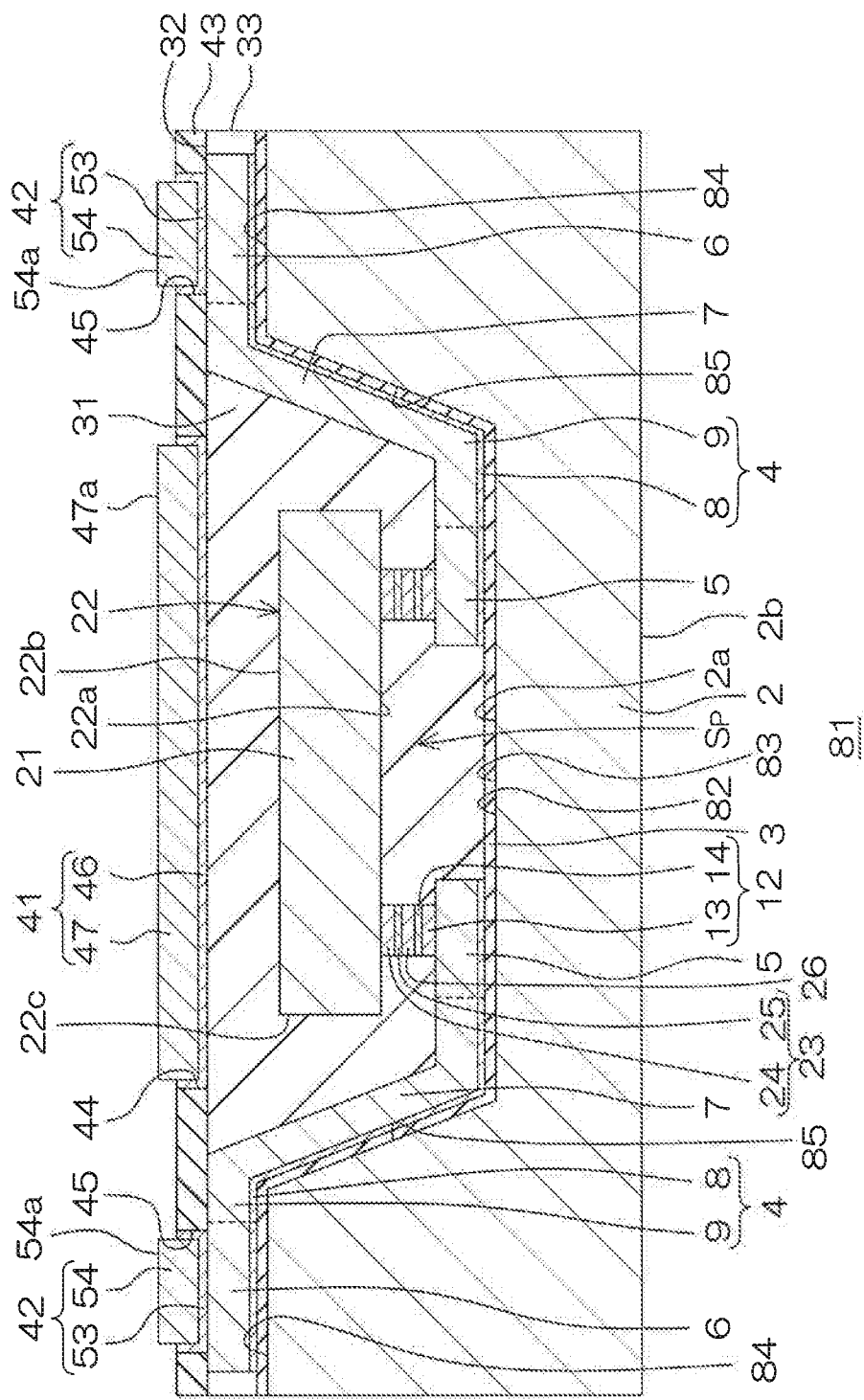
FIG. 11 is a cross sectional view taken along line XI-XI shown in FIG. 10.

FIG. 10 is a plan view of an electronic component 81 according to a third preferred embodiment of the present invention. FIG. 11 is a cross sectional view taken along line XI-XI shown in FIG. 10. In the preferred embodiment, the same reference signs are given to structures corresponding to structures of the first preferred embodiment described above, and descriptions thereof will be omitted. In FIG. 10, the heat dissipation member 41 and the external terminals 42 are hatched for clarity.

Referring to FIG. 10 to FIG. 11, the first principal surface 2a of the interposer 2 has a recessed portion 82 hollowed toward the second principal surface 2b. The second principal surface 2b of the interposer 2 has a flat surface.

The recessed portion 82 is formed in a central portion of the first principal surface 2a of the interposer 2 so as to be spaced inward from the periphery of the interposer 2. The recessed portion 82 is formed in a quadrilateral shape parallel to the sides of the interposer 2 in the plan view.

The recessed portion 82 may be formed in a polygonal shape in the plan view instead of the quadrilateral shape. The recessed portion 82 may be formed in a circular shape or an elliptical shape in the plan view.

The first principal surface 2a of the interposer 2 includes a low region portion 83, a high region portion 84, and a connecting portion 85. The low region portion 83 is formed by a bottom portion of the recessed portion 82. The high region portion 84 is formed by a region surrounding the recessed portion 82. The connecting portion 85 connects the low region portion 83 and the high region portion 84.

The low region portion 83 is formed in a quadrilateral shape parallel to the sides of the interposer 2 in the plan view. The high region portion 84 is formed in a quadrilateral ring shape surrounding the recessed portion 82 in the plan view. The recessed portion 82 is formed in a tapered manner in a cross sectional view in which the opening width gradually narrows from the high region portion 84 to the low region portion 83. Therefore, the connecting portion 85 has a slanted surface slanted downwardly from the high region portion 84 toward the low region portion 83.

The plurality of first electrode pad films 5 are formed in the low region portion 83 of the interposer 2. The plurality of second electrode pad films 6 are formed in the high region portion 84 of the interposer 2. The connection electrode film 7 is laid around from the corresponding first electrode pad film 5 to the corresponding second electrode pad film 6 across the connecting portion 85, in a region between the corresponding first electrode pad film 5 and the corresponding second electrode pad film 6.

The chip 21 is accommodated in the recessed portion 82 of the interposer 2. The chip 21 is electrically connected to the first electrode pad films 5 via the protruding electrodes 12 inside the recessed portion 82.

The chip 21 is accommodated in the recessed portion 82 such that both the mounting surface 22a and the non-mounting surface 22b of the chip body 22 are positioned in a region between the low region portion 83 and the high region portion 84 of the interposer 2.

That is, the recessed portion 82 has a depth with which both the mounting surface 22a and the non-mounting surface 22b of the chip body 22 are positioned closer to the low region portion 83 than the high region portion 84, in a state where the chip 21 is accommodated in the recessed portion 82.

The mounting surface 22a and the non-mounting surface 22b of the chip body 22 have an area smaller than an area of the low region portion 83 in the plan view, respectively. The entire region of the mounting surface 22a of the chip body 22 may be opposed to the low region portion 83. That is, the entire periphery of the chip body 22 may be positioned in a region surrounded by the periphery of the low region portion 83.

A portion of the mounting surface 22a of the chip body 22 may be opposed to a portion of the connecting portion 85. The mounting surface 22a and the non-mounting surface 22b of the chip body 22 may have an area greater than the area of the low region portion 83 in the plan view, respectively.

The electronic component 81 has no pillar electrode 30 in the preferred embodiment, unlike the first preferred embodiment described above. In the electronic component 81, the sealing resin 31 fills the recessed portion 82 and seals the chip 21 such that at least the second electrode pad films 6 of the wiring film 4 are exposed. The resin principal surface 32 of the sealing resin 31 is formed so as to be flush with respect to the surfaces of the second electrode pad films 6.

The second electrode pad films 6 are exposed from the plurality of second openings 45 of the insulating film 43, respectively. The external terminals 42 are directly connected to the respective second electrode pad films 6 inside the respective second openings 45 of the sealing resin 31. The heat dissipation member 41 is opposed to the chip 21 across the sealing resin 31. The heat dissipation member 41 is therefore formed in a region immediately above the recessed portion 82.

The step of forming the recessed portion 82 is performed after the step of preparing the interposer 2 (step S1 shown in FIG. 5) and before the step of forming the surface insulating film 3 (step S2 shown in FIG. 5).

In this step, first, a mask having a predetermined pattern is formed on the first principal surface 2a of the interposer 2. The mask selectively has an opening exposing a region in which a recessed portion 82 is to be formed.

Next, an unnecessary portion of the interposer 2 exposed from the opening of the mask is removed by, for example, an etching method via the mask. The etching method may be a wet etching method. Thereafter, the mask is removed. The recessed portion 82 is thereby formed at the first principal surface 2a of the interposer 2.

The structure in which the external terminals 42 are directly connected to the second electrode pad films 6 can be formed through the following steps. First, the step of forming the pillar electrodes 30 (step S5 shown in FIG. 5) is eliminated from the flowchart shown in FIG. 5 described above.

In the step of forming a sealing resin 31 (step S7 shown in FIG. 5), the sealing resin 31 is supplied onto the first principal surface 2a of the interposer 2 to fill the recessed portion 82 and cover the chip 21 and the wiring film 4. In the step of grinding the sealing resin 31 (step S8 shown in FIG. 5), the resin principal surface 32 of the sealing resin 31 is ground until the second electrode pad films 6 are exposed.

The sealing resin 31 having the resin principal surface 32 flush with respect to the surfaces of the second electrode pad films 6 is thereby formed. Thereafter, steps similar to steps of forming the heat dissipation member 41 and the external terminals 42 are performed (steps S10 to S16 shown in FIG. 6). The structure in which the external terminals 42 are directly connected to the second electrode pad films 6 can thus be formed.

As described above, according to the electronic component 81, the same effect as the effect described in the first preferred embodiment can be exhibited as well.

According to the electronic component 81, the chip 21 is accommodated in the recessed portion 82. The distance between the second principal surface 2b of the interposer 2 and the non-mounting surface 22b of the chip 21 can thus be reduced by an amount corresponding to the depth of the recessed portion 82.

Further, according to the electronic component 81, the external terminals 42 are directly connected to the second electrode pad films 6 without using the pillar electrode 30, unlike the first preferred embodiment. The distance between the second principal surface 2b of the interposer 2 and the resin principal surface 32 of the sealing resin 31 can thus be reduced. Therefore, a reduction in size of the electronic component 81 due to a reduction in height can thereby be reliably achieved, while improving the heat dissipation property.

Moreover, according to the electronic component 81, the distance between the chip 21 and the heat dissipation member 41 can be further reduced due to the absence of the pillar electrodes 30. A heat transfer path between the chip 21 and the heat dissipation member 41 can thus be shortened. Heat generated at the chip 21 can thereby be transferred to the heat dissipation member 41 successfully. As a result, the heat dissipation property can be reliably improved.

Figure 12:
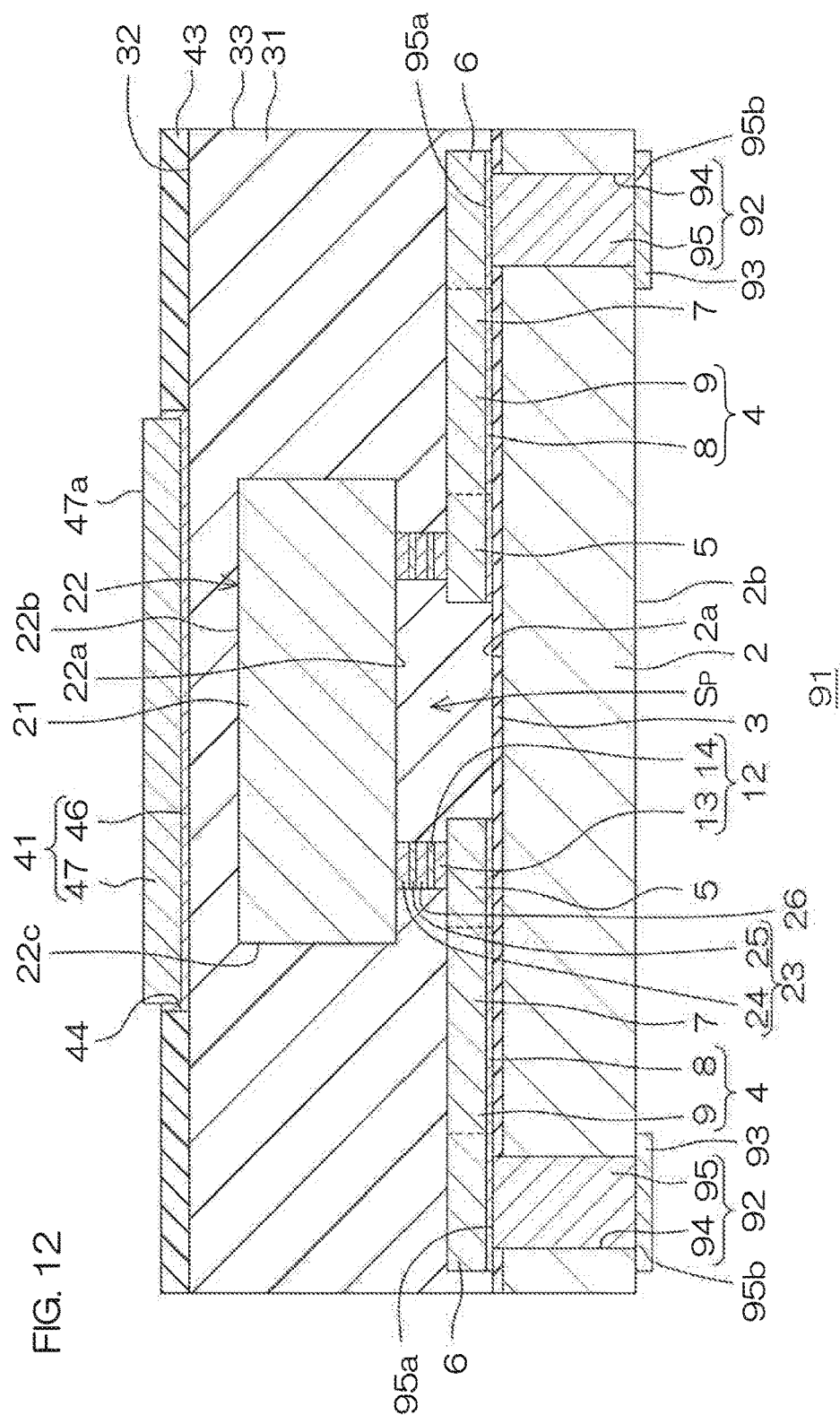
FIG. 12 is a cross sectional view of an electronic component according to a fourth preferred embodiment of the present invention.

FIG. 12 is a cross sectional view showing an electronic component 91 according to a fourth preferred embodiment of the present invention. In the preferred embodiment, the same reference signs are given to structures corresponding to structures of the first preferred embodiment described above, and descriptions thereof will be omitted.

The electronic component 91 has via electrodes 92 and external terminals 93 instead of the pillar electrodes 30 and the external terminals 42. The via electrode 92 may be a Through Silicon Via (TSV) formed in the interposer 2 made of silicon.

The via electrodes 92 each include a conductor 95 embedded in a via hole 94 formed in the interposer 2. The via hole 94 is formed at a position overlapped by the corresponding second electrode pad film 6 in the plan view.

The via electrode 92 includes an upper end portion 95a and a lower end portion 95b. The upper end portion 95a of the via electrode 92 is electrically connected to the second electrode pad film 6. The lower end portion 95b of the via electrode 92 is exposed from the second principal surface 2b of the interposer 2.

The external terminals 93 are connected to the lower end portion 95b of the corresponding via electrode 92, respectively. The external terminals 93 may have a laminated structure including an Ni film, a Pd film, and an Au film laminated in this order from the via electrode 92, respectively. The external terminals 93 cover the entire lower end portion 95b of the via electrode 92, respectively. The external terminals 93 may partially overlap the second principal surface 2b of the interposer 2, respectively.

As described above, according to the electronic component 91, the same effect as the effect described in the first preferred embodiment can be exhibited as well. The structure having the via electrodes 92 and the external terminals 93 is also applicable to the second preferred embodiment and the third preferred embodiment described above.

Figure 13:
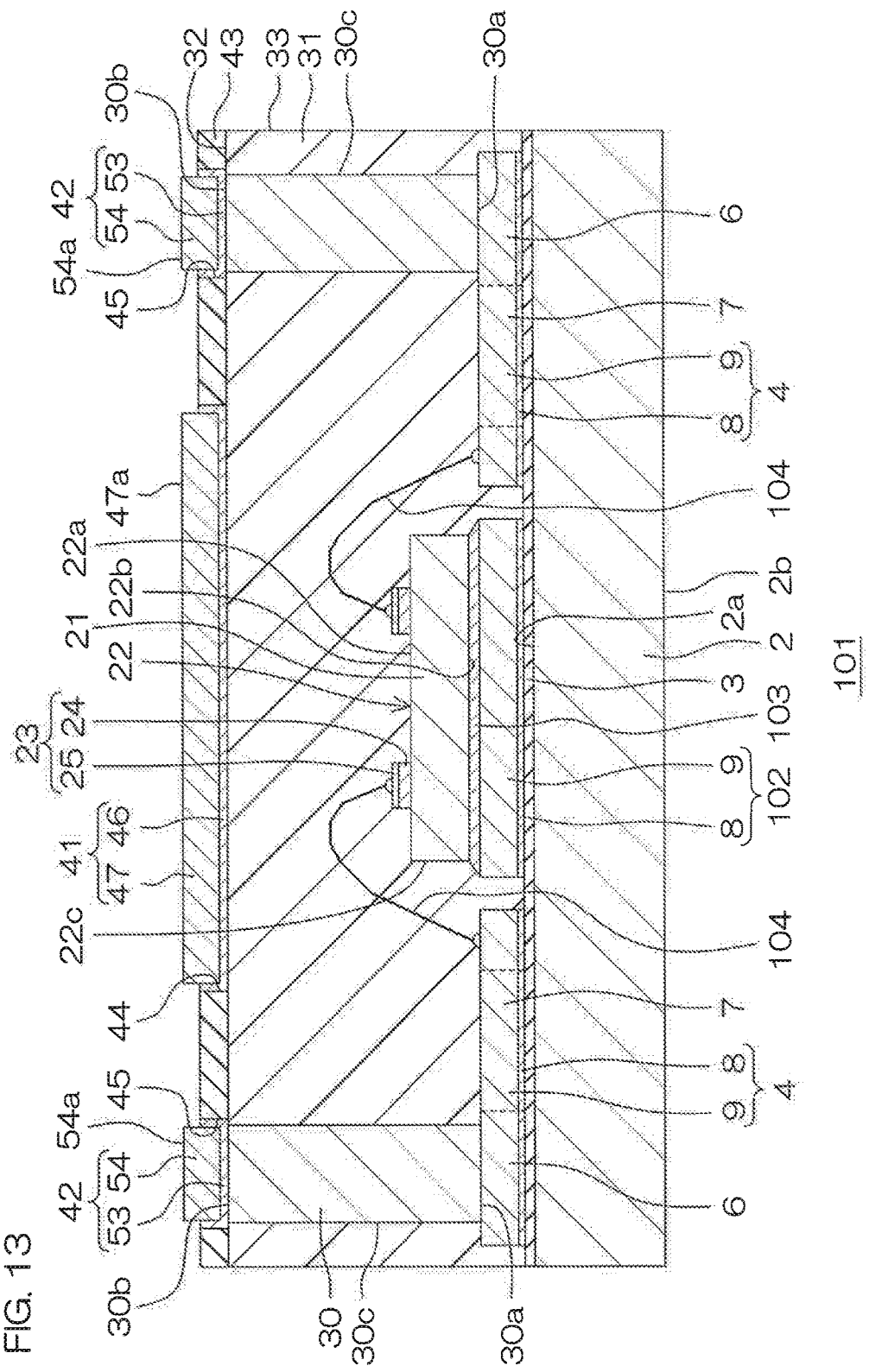
FIG. 13 is a cross sectional view of an electronic component according to a fifth preferred embodiment of the present invention.

FIG. 13 is a cross sectional view of an electronic component 101 according to a fifth preferred embodiment of the present invention. In the preferred embodiment, the same reference signs are given to structures corresponding to structures of the first preferred embodiment described above, and descriptions thereof will be omitted.

According to the electronic component 101, the chip 21 is arranged at the first principal surface 2a of the interposer 2 in a posture in which the non-mounting surface 22b faces the first principal surface 2a of the interposer 2.

The wiring film 4 further includes a die pad 102 in the electronic component 101. The die pad 102 is formed in a central portion of the first principal surface 2a of the interposer 2. The plurality of first electrode pad films 5 are arranged around the die pad 102 at intervals from each other.

The die pad 102 is formed by changing the layout of the mask in the step of forming the wiring film 4 (step S3 shown in FIG. 5). Therefore, the die pad 102 has a laminated structure including the seed layer 8 and the conductor layer 9.

The chip 21 is arranged at the die pad 102 in a posture in which the non-mounting surface 22b faces the first principal surface 2a of the interposer 2. The non-mounting surface 22b of the chip 21 is bonded to the die pad 102 via a bonding material 103. The bonding material 103 may be a metal bonding material. The metal bonding material may include a solder or a metallic paste. The bonding material 103 may be an insulating bonding material.

The terminal electrodes 23 of the chip 21 are electrically connected to the first electrode pad films 5 via conductive leads 104. The conductive leads 104 may include bonding wires, etc.

As described above, according to the electronic component 101, the same effect as the effect described in the first preferred embodiment can be exhibited as well. The structure where the chip 21 is arranged at the first principal surface 2a of the interposer 2 in a posture in which the non-mounting surface 22b faces the first principal surface 2a of the interposer 2 is also applicable to the second preferred embodiment, the third preferred embodiment and the fourth preferred embodiment described above.

Figure 14:
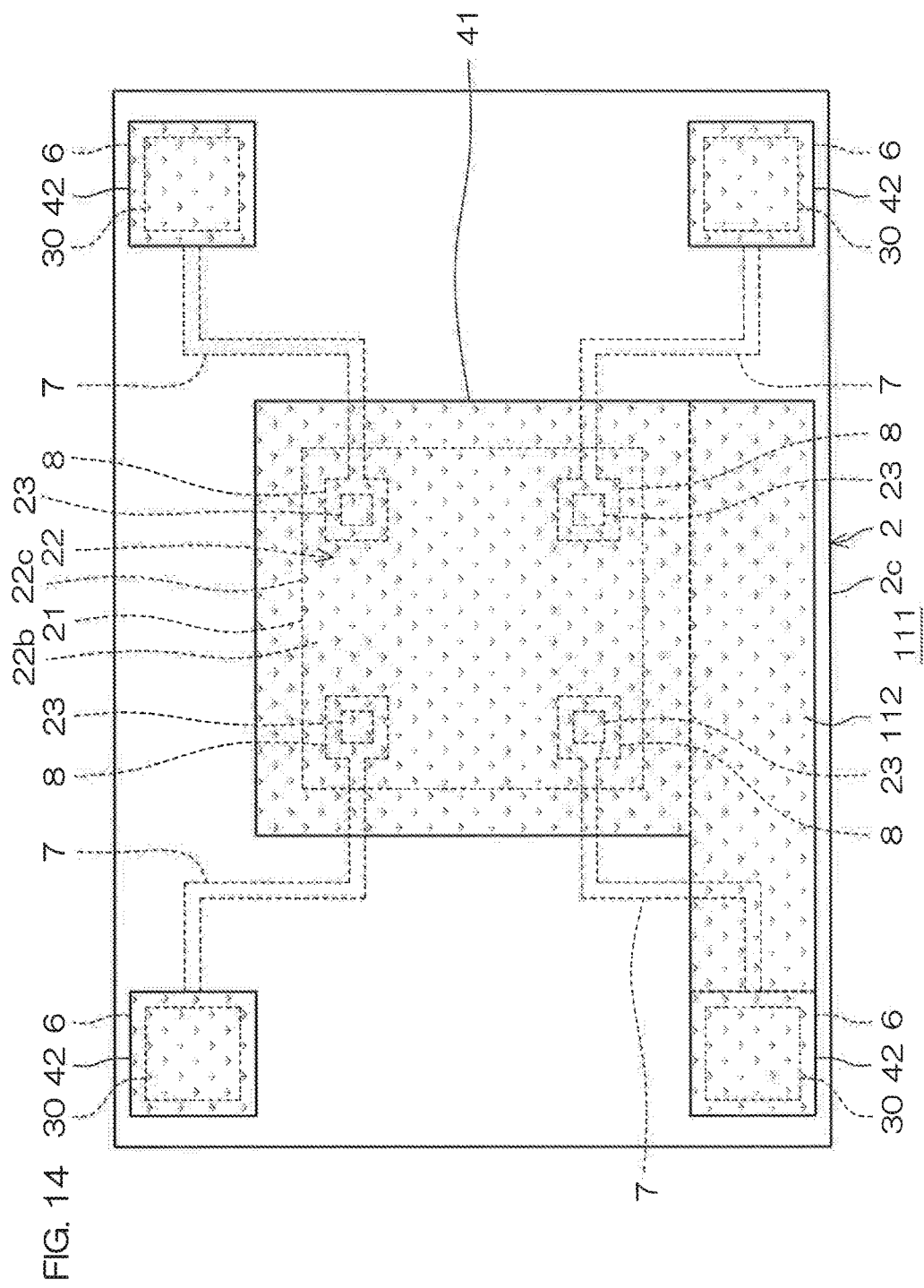
FIG. 14 is a plan view of an electronic component according to a sixth preferred embodiment of the present invention.

FIG. 14 is a plan view of an electronic component 111 according to a sixth preferred embodiment of the present invention. In the preferred embodiment, the same reference signs are given to structures corresponding to structures of the first preferred embodiment described above, and descriptions thereof will be omitted. In FIG. 14, the heat dissipation member 41 and the external terminals 42, for example, are hatched for clarity.

A connecting portion 112 that connects at least one of the external terminals 42 and the heat dissipation member 41 is formed on the resin principal surface 32 of the sealing resin 31 in the electronic component 111. The heat dissipation member 41 is connected to one of the external terminals 42 via the connecting portion 112 in the preferred embodiment.

The heat dissipation member 41, one of the external terminals 42, and the connecting portion 112 are therefore formed as one external terminal. The three other external terminals 42 are electrically insulated from the heat dissipation member 41.

A third opening (not shown) communicating to the first opening 44 and the second openings 45 is formed in the insulating film 43 in the electronic component 111. The connecting portion 112 is formed in the third opening.

As described above, according to the electronic component 111, the same effect as the effect described in the first preferred embodiment can be exhibited as well. The structure where the connecting portion 112 that connects at least one of the external terminals 42 and the heat dissipation member 41 is also applicable to the second preferred embodiment, the third preferred embodiment, the forth preferred embodiment and the fifth preferred embodiment.

Figure 15:
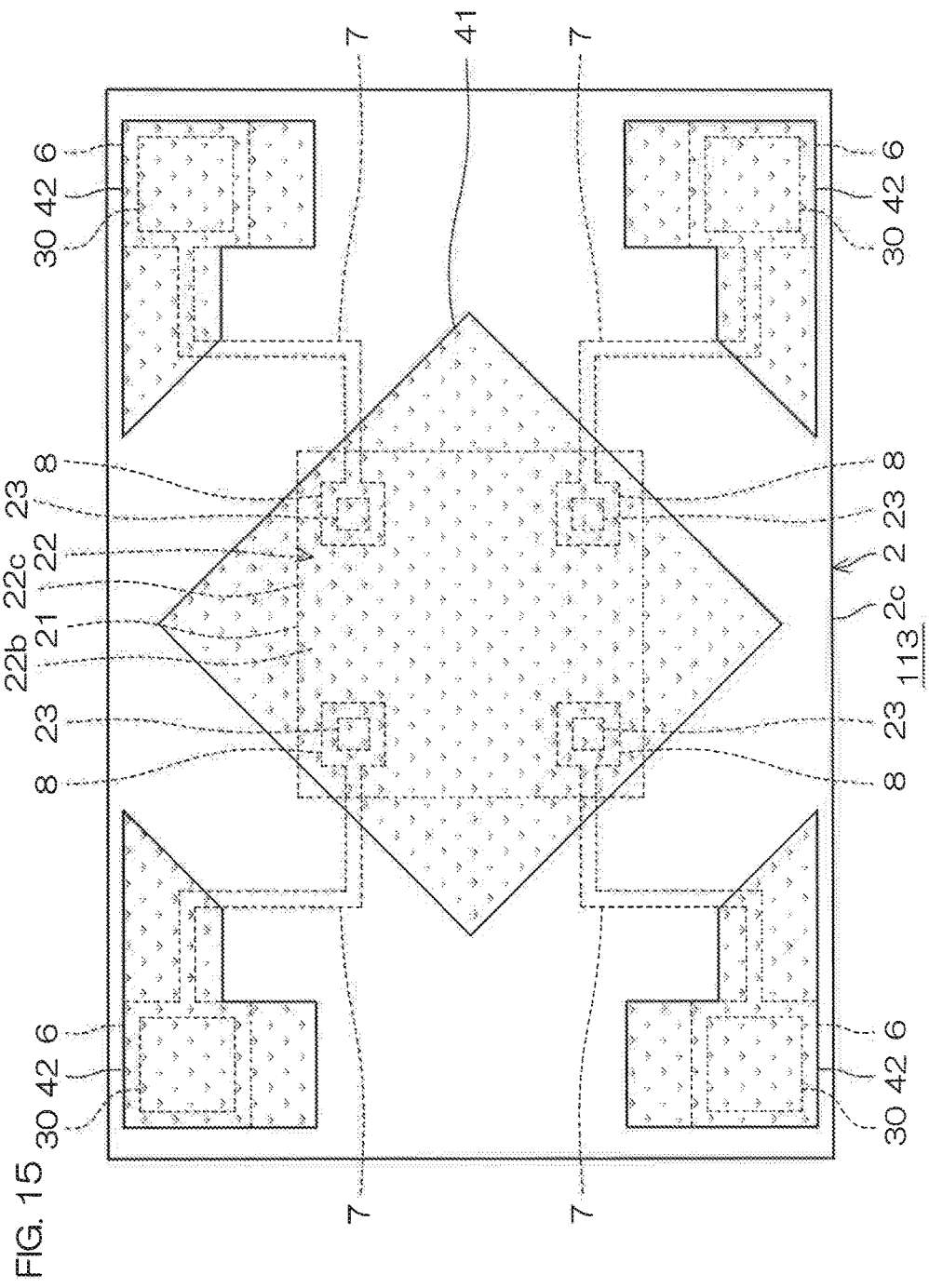
FIG. 15 is a plan view of an electronic component according to a seventh preferred embodiment of the present invention.

FIG. 15 is a plan view of an electronic component 113 according to a seventh preferred embodiment of the present invention. the same reference signs are given to structures corresponding to structures of the first preferred embodiment described above, and descriptions thereof will be omitted. In FIG. 15, the heat dissipation member 41 and the external terminals 42 are hatched for clarity.

The heat dissipation member 41 is formed in a quadrilateral shape non-parallel to the sides of the interposer 2 in the plan view in the electronic component 113. That is, the sides of the heat dissipation member 41 extend in directions to intersect to the sides of the interposer 2.

The heat dissipation member 41 has an area greater than an area of the chip 21 in the plan view. The heat dissipation member 41 is opposed to the non-mounting surface 22b of the chip 21 so as to expose corners of the chip 21 in the plan view. The heat dissipation member 41 may be opposed to the entire region of the non-mounting surface 22b of the chip 21.

The heat dissipation member 41 may be formed in a polygonal shape, such as a triangular shape or a hexagonal shape, in the plan view, instead of the quadrilateral shape. The heat dissipation member 41 may be formed in a circular shape or an elliptical shape in the plan view.

Each of the external terminals 42 may be formed in an L shape extending along two of the sides of the interposer 2 orthogonal to each other in the plan view. The external terminal 42 may be formed in a polygonal shape, such as a triangular shape or a hexagonal shape, in the plan view, instead of the quadrilateral shape. The external terminal 42 may be formed in a circular shape or an elliptical shape in the plan view.

As described above, according to the electronic component 113, the same effect as the effect described in the first preferred embodiment can be exhibited as well. The heat dissipation member 41 and the external terminals 42 of the electronic component 113 are also applicable to the second preferred embodiment, the third preferred embodiment, the forth preferred embodiment, the fifth preferred embodiment and the sixth preferred embodiment described above.

While several preferred embodiments of the present invention have been described above, the present invention may be implemented in still another form.

Figure 16:
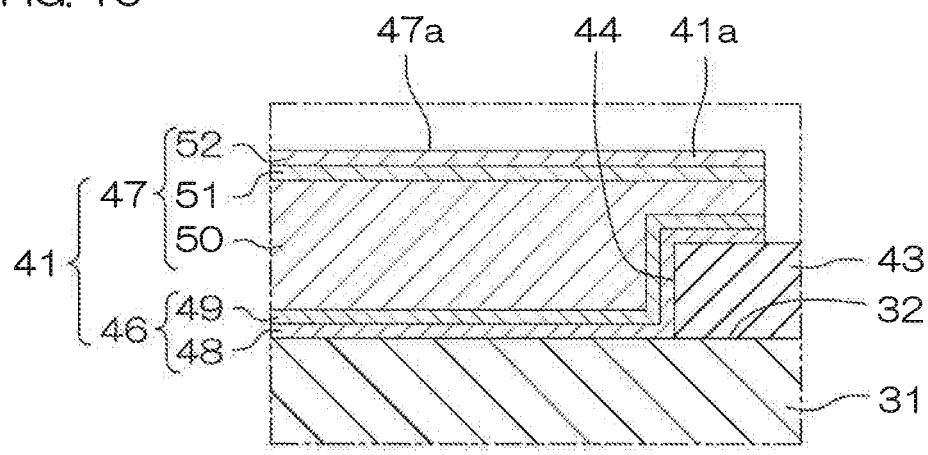
FIG. 16 is a view for explaining a modified example of a heat dissipation member.

The structure shown in FIG. 16 may be employed in the first preferred embodiment described above. FIG. 16 is an enlarged cross sectional view of a portion corresponding to FIG. 4B and is a view for explaining a modified example of a heat dissipation member 41. In the modified example, the same reference signs are given to structures corresponding to structures of the first preferred embodiment described above, and descriptions thereof will be omitted.

Referring to FIG. 16, the heat dissipation member 41 may have an overlapped portion 41a formed so as to extend from inside the first opening 44 onto the surface of the insulating film 43. That is, the seed layer 46 and the metallic layer 47 of the heat dissipation member 41 may each have an overlapped portion 41a provided so as to extend from inside the first opening 44 onto the surface of the insulating film 43. The heat dissipation member 41 is electrically insulated from the external terminals 42 in a state having the overlapped portion 41a in the modified example.

As not shown, the external terminals 42 may each have an overlapped portion formed so as to extend from inside the corresponding second opening 45 onto the surface of the insulating film 43, likewise the heat dissipation member 41. That is, the seed layer 53 and the metallic layer 54 of each external terminal 42 may each have an overlapped portion 41a provided so as to extend from inside the corresponding second opening 45 onto the surface of the insulating film 43. The external terminals 42 are electrically insulated from the heat dissipation member 41 in a state each having the overlapped portion.

The heat dissipation member 41 and the external terminals 42 having such structures can be formed by changing the layout of the mask 63 in the step of forming the mask 63 (step S13 shown in FIG. 6). The structure according to the modified example is also applicable to the second preferred embodiment, the third preferred embodiment, the forth preferred embodiment, the fifth preferred embodiment, the sixth preferred embodiment and seventh preferred embodiment described above.

The present application corresponds to Japanese Patent Application No. 2016-139707 filed on Jul. 14, 2016, at the Japan Patent Office, the disclosure of which is incorporated herein by reference in its entirety.

Although the preferred embodiments of the present invention have been described in detail, these preferred embodiments are merely concrete examples used to clarify the technical contents of the present invention, and the present invention should not be construed as being limited to these concrete examples, and the scope of the present invention is limited solely by the appended claims.

What is claimed is:

1. An electronic component, comprising:
a substrate having a principal surface;
a chip arranged at the principal surface of the substrate;
a sealing resin sealing the chip on the principal surface of the substrate;
a heat dissipation member formed on the sealing resin;
an insulating film covering the sealing resin and having an opening which selectively exposes the sealing resin such that the sealing resin has an exposed surface;
a wiring formed at the principal surface of the substrate;
an external terminal formed on the sealing resin and electrically connected to the wiring; and
a pillar electrode formed so as to penetrate the sealing resin and electrically connected to the wiring,
wherein the heat dissipation member is formed on the exposed surface of the sealing resin,
the heat dissipation member has a laminated structure including a seed layer and a metallic layer laminated in this order from the sealing resin,
the chip includes a terminal electrode,
the chip is arranged at the principal surface of the substrate such that the terminal electrode is electrically connected to the wiring, and
the external terminal is electrically connected to the wiring via the pillar electrode.

2. The electronic component according to claim 1, wherein the heat dissipation member is opposed to the chip across the sealing resin.

3. The electronic component according to claim 1, wherein an area of the heat dissipation member is equal to or greater than an area of the chip as viewed in plan.

4. The electronic component according to claim 3, wherein the heat dissipation member is opposed to an entire region of the chip across the sealing resin.

5. The electronic component according to claim 1, wherein the metallic layer has a laminated structure in which a plurality of metallic films are laminated.

6. The electronic component according to claim 1, wherein the exposed surface of the sealing resin is positioned at a region immediately above the chip.

7. The electronic component according to claim 1, wherein the seed layer is formed along the exposed surface of the sealing resin and an inner wall surface of the opening formed in the insulating film.

8. The electronic component according to claim 1, wherein the chip includes a chip principal surface at which the terminal electrode is formed, and
the chip is arranged at the principal surface of the substrate in a posture in which the chip principal surface faces the principal surface of the substrate.

9. The electronic component according to claim 1, wherein
the heat dissipation member includes a metallic material, and
the external terminal includes the same metallic material as the heat dissipation member.

10. An electronic component, comprising:
a substrate having a principal surface at which a recessed portion is formed;
a chip arranged at the principal surface of the substrate so as to be accommodated in the recessed portion;
a sealing resin filling the recessed portion and sealing the chip;
a heat dissipation member formed on the sealing resin;
a wiring formed on the principal surface of the substrate and withdrawn from an inside region of the recessed portion to an outside region of the recessed portion in the substrate; and
an insulating film covering the sealing resin and having an opening which selectively exposes the sealing resin such that the sealing resin has an exposed surface,
wherein the chip includes a terminal electrode,
the chip is arranged at the principal surface of the substrate such that the terminal electrode is electrically connected to the wiring in the inside region of the recessed portion of the substrate, and
the heat dissipation member is formed on the exposed surface of the sealing resin.

11. The electronic component according to claim 10, wherein the heat dissipation member is opposed to the chip across the sealing resin.

12. The electronic component according to claim 10, wherein an area of the heat dissipation member is equal to or greater than an area of the chip as viewed in plan.

13. The electronic component according to claim 12, wherein the heat dissipation member is opposed to the entire region of the chip across the sealing resin.

14. The electronic component according to claim 10, wherein the exposed surface of the sealing resin is positioned at a region immediately above the chip.

15. The electronic component according to claim 10, wherein the chip includes a chip principal surface at which the terminal electrode is formed, and
the chip is arranged at the principal surface of the substrate in a posture in which the chip principal surface faces the principal surface of the substrate.

16. The electronic component according to claim 10, wherein
the principal surface of the substrate includes a low region portion formed by a bottom portion of the recessed portion and a high region portion formed by the outside region of the recessed portion,
the chip includes a first chip principal surface at which the terminal electrode is formed and a second chip principal surface positioned on a side opposite to the first chip principal surface, and
the chip is accommodated in the recessed portion of the substrate such that both the first chip principal surface and the second chip principal surface are positioned in a region between the low region portion and the high region portion of the substrate.

17. An electronic component, comprising:
a substrate having a principal surface at which a recessed portion is formed;
a chip arranged at the principal surface of the substrate so as to be accommodated in the recessed portion;
a sealing resin filling the recessed portion and sealing the chip;
a heat dissipation member formed on the sealing resin;
a wiring formed on the principal surface of the substrate and withdrawn from an inside region of the recessed portion to an outside region of the recessed portion in the substrate; and
an external terminal formed on the sealing resin so as to be electrically connected to the wiring in the outside region of the recessed portion of the substrate,
wherein the chip includes a terminal, and
the chip is arranged at the principal surface of the substrate such that the terminal electrode is electrically connected to the wiring in the inside region of the recessed portion of the substrate.

18. The electronic component according to claim 17, further comprising a pillar electrode formed so as to penetrate the sealing resin and electrically connected to the wiring in the outside region of the recessed portion of the substrate, wherein
the external terminal is electrically connected to the wiring via the pillar electrode.

19. The electronic component according to claim 17, wherein
the heat dissipation member includes a metallic material, and
the external terminal includes the same metallic material as the heat dissipation member.

* * * * *